(12) United States Patent
Kim

(10) Patent No.: US 9,778,980 B2
(45) Date of Patent: Oct. 3, 2017

(54) CONTROLLER, SEMICONDUCTOR MEMORY SYSTEM AND OPERATING METHOD THEREOF

(71) Applicant: SK hynix Inc., Gyeonggi-do (KR)

(72) Inventor: Do-Hun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/875,403

(22) Filed: Oct. 5, 2015

(65) Prior Publication Data

US 2016/0328287 A1    Nov. 10, 2016

(30) Foreign Application Priority Data

May 7, 2015    (KR) .................. 10-2015-0064012

(51) Int. Cl.
| | | |
|---|---|---|
| *G11C 29/00* | (2006.01) | |
| *G06F 11/10* | (2006.01) | |
| *G11C 11/56* | (2006.01) | |
| *G11C 16/26* | (2006.01) | |
| *G11C 29/04* | (2006.01) | |

(52) U.S. Cl.
CPC ...... *G06F 11/1012* (2013.01); *G11C 11/5642* (2013.01); *G11C 16/26* (2013.01); *G11C 2029/0411* (2013.01)

(58) Field of Classification Search
CPC .. G06F 11/1012; G11C 11/5642; G11C 16/26
See application file for complete search history.

(56) References Cited

U.S. PATENT DOCUMENTS

| 8,370,561 B2 | 2/2013 | Sharon et al. | |
|---|---|---|---|
| 2014/0040531 A1* | 2/2014 | Wu | G06F 11/1048 711/103 |
| 2014/0040704 A1* | 2/2014 | Wu | G11C 29/52 714/773 |
| 2015/0220389 A1* | 8/2015 | Kim | G06F 11/1048 714/764 |

FOREIGN PATENT DOCUMENTS

| KR | 1020100039647 | 4/2010 |
|---|---|---|
| KR | 1020120097963 | 9/2012 |

* cited by examiner

*Primary Examiner* — Sam Rizk
(74) *Attorney, Agent, or Firm* — IP & T Group LLP

(57) ABSTRACT

An operating method of a memory controller includes: generating a soft decision read data for stored data read from a semiconductor memory device according to a soft decision read voltage, wherein the stored data is stored in the semiconductor memory device through sequential operations of ECC encoding and scrambling; and generating a first de-scrambled data by performing de-scrambling operation to a sign bit of the soft decision read data.

17 Claims, 21 Drawing Sheets

<IDEAL>

- After 1 iteration
$\underline{v} = (\ 0\ \ 1\ \ 1\ \ 0\ \ 1\ \ 0\ \ 0\ \ 0\ \ 1\ \ 1\ )$ Syndrome check → Perform next iteration

CONTROLLER, SEMICONDUCTOR MEMORY SYSTEM AND OPERATING METHOD THEREOF

CROSS-REFERENCE TO RELATED APPLICATIONS

The present application claims priority of Korean Patent Application No. 10-2015-0064012, filed on May 7, 2015, which is incorporated herein by reference in its entirety.

BACKGROUND

1. Field

Various exemplary embodiments of the present invention relate to a controller, a semiconductor memory system and an operating method thereof.

2. Description of the Related Art

In general, semiconductor memory devices are classified into volatile memory devices, such as Dynamic Random Access Memory (DRAM) and Static RAM (SRAM), and non-volatile memory devices, such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.

Volatile memory devices lose their stored data when their power supplies are interrupted, whereas non-volatile memory device retain their stored data even when their power supplies are Interrupted. Non-volatile flash memory devices are widely used as storage mediums in computer systems because of their high program speed, low power consumption and large data storage capacity.

In non-volatile memory devices, especially in flash memory devices, the data state of each memory cell depends on the number of bits that the memory cell can program. A memory cell storing 1-bit data per cell is called a single-bit cell or a single-level cell (SLC). A memory cell storing multi-bit data (i.e., 2 or more bits data) per cell is called a multi-bit cell, a multi-level cell (MLC) or a multi-state cell. An MLC is advantageous for high integration. However, as the number of bits programmed in each memory cell increases, the reliability decreases and the read failure rate increases.

For example, when k bits are to be programmed in a memory cell, one of $2^k$ threshold voltages is formed in the memory cell. Due to minute differences between the electrical characteristics of memory cells, the threshold voltages of memory cells programmed for the same data form threshold voltage distribution. Threshold voltage distributions correspond to $2^k$ data values corresponding to k-bit information, respectively.

However, a voltage window available for threshold voltage distributions is finite. Therefore, as the value k increases, the distance between the threshold voltage distributions decreases and the neighboring threshold voltage distributions overlap. As the neighboring threshold voltage distributions overlap, read data may include error bits.

FIG. 1 is a threshold voltage distribution schematically Illustrating program and erase states of a 3-bit MLC non-volatile memory device.

FIG. 2 is a threshold voltage distribution schematically illustrating program and erase states due to characteristic deterioration of the 3-bit MLC non-volatile memory device.

In an MLC non-volatile memory device, e.g., an MLC flash memory device capable of storing k-bit data in a single memory cell, the memory cell may have one of $2^k$ threshold voltage distributions. For example, the 3-bit MLC has one of 8 threshold voltage distributions.

Threshold voltages of memory cells programmed for the same data form the threshold voltage distribution due to characteristic differences between memory cells. In the 3-bit MLC non-volatile memory device, as illustrated in FIG. 1, threshold voltage distributions are formed in correspondence with the data states including 7 program states 'P1' to 'P7' and an erase state 'E'.

FIG. 1 shows an ideal case in which threshold voltage distributions do not overlap and have sufficient read voltage margins therebetween. Referring to the flash memory example of FIG. 2, the memory cell may experience charge loss in which electrons trapped at a floating gate or tunnel oxide film are discharged over time. Such charge loss may accelerate when the tunnel oxide film deteriorates by iterative program and erase operations. Charge loss results in a decrease in the threshold voltages of memory cells. For example, as illustrated in FIG. 2, the threshold voltage distribution may be shifted left due to charge loss.

Further, program disturbance, erase disturbance and/or back pattern dependency also cause increases in threshold voltages. As characteristics of memory cells deteriorate, neighbouring threshold voltage distributions may overlap, as illustrated in FIG. 2.

Once neighbouring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap, a memory cell that has the third program state 'P3' may be erroneously determined to have the second program state 'P2'. In short, when the neighbouring threshold voltage distributions overlap as illustrated in FIG. 2, read data may include a significant number of errors.

What is therefore required is a scheme for precisely reading data stored in memory cells of a semiconductor memory device.

SUMMARY

Various embodiments of the present invention are directed to a controller, a semiconductor memory system, and an operating method thereof capable of precisely reading data stored in memory cells of a semiconductor memory device.

In accordance with an embodiment of the present invention, an operating method of a memory controller may include: generating a soft decision read data for stored data read from a semiconductor memory device according to a soft decision read voltage, wherein the stored data is stored in the semiconductor memory device through sequential operations of ECC encoding and scrambling; and generating a first de-scrambled data by performing a de-scrambling operation to a sign bit of the soft decision read data.

Preferably, the operating method may further include performing a first ECC decoding operation to the first de-scrambled data.

Preferably, the first ECC decoding operation may be performed according to an ECC algorithm based on a bilateral-symmetry channel.

Preferably, the bilateral-symmetry channel may be an additive white gaussian noise (AWGN) channel.

Preferably, the first ECC decoding operation may be a low density parity check (LDPC) decoding operation.

Preferably, the soft decision read data may be a log likelihood ratio (LLR).

Preferably, before the generating of the soft decision read data, the operating method may further include: generating a second de-scrambled data by performing de-scrambling operation to stored data read from the semiconductor memory device according to a hard decision read voltage, wherein the de-scrambling may correspond to the scrambling; and performing a second ECC decoding operation to the second de-scrambled data.

Preferably, the generating of the soft decision read data may be performed when the second ECC decoding operation fails.

In accordance with an embodiment of the present invention, a memory controller may include: a soft decision read data generation unit suitable for generating a soft decision read data for stored data read from a semiconductor memory device according to a soft decision read voltage, wherein the stored data is stored in the semiconductor memory device through sequential operations of ECC encoding and scrambling; and a de-scrambling unit suitable for generating a first de-scrambled data by performing de-scrambling operation to a sign bit of the soft decision read data.

Preferably, the memory controller may further include an ECC decoding unit suitable for performing a first ECC decoding operation to the first de-scrambled data.

Preferably, the ECC decoding unit may perform the first ECC decoding operation according to an ECC algorithm based on a bilateral-symmetry channel.

Preferably, the bilateral-symmetry channel may be an additive white gaussian noise (AWGN) channel.

Preferably, the first ECC decoding operation unit may perform a low density parity check (LDPC) decoding operation.

Preferably, the soft decision read data may be a log likelihood ratio (LLR).

Preferably, before the soft decision read data generation unit generates the soft decision read data, the de-scrambling unit may further generate a second de-scrambled data by performing de-scrambling operation to stored data read from the semiconductor memory device according to a hard decision read voltage. The de-scrambling operation may correspond to the scrambling operation. The memory controller may further include an ECC decoding unit suitable for performing a second ECC decoding operation to the second de-scrambled data.

Preferably, the soft decision read data generation unit may generate the soft decision read data when the ECC decoding unit fails the second ECC decoding operation.

In accordance with an embodiment of the present invention, a semiconductor memory system may include: a semiconductor memory device; and a controller. The controller may include: a soft decision read data generation unit suitable for generating a soft decision read data for stored data read from the semiconductor memory device according to a soft decision read voltage, wherein the stored data is stored in the semiconductor memory device through sequential operations of ECC encoding and scrambling; and a de-scrambling unit suitable for generating a first de-scrambled data by performing a de-scrambling operation to a sign bit of the soft decision read data.

Preferably, the controller may further include an ECC decoding unit suitable for performing a first ECC decoding operation to the first de-scrambled data.

Preferably, the ECC decoding unit may perform the first ECC decoding operation according to an ECC algorithm based on a bilateral-symmetry channel.

Preferably, the soft decision read data may be a log likelihood ratio (LLR).

In accordance with various embodiments of the present invention, data stored in memory cells of a semiconductor memory device may be precisely read.

DETAILED DESCRIPTION

Figure 1:
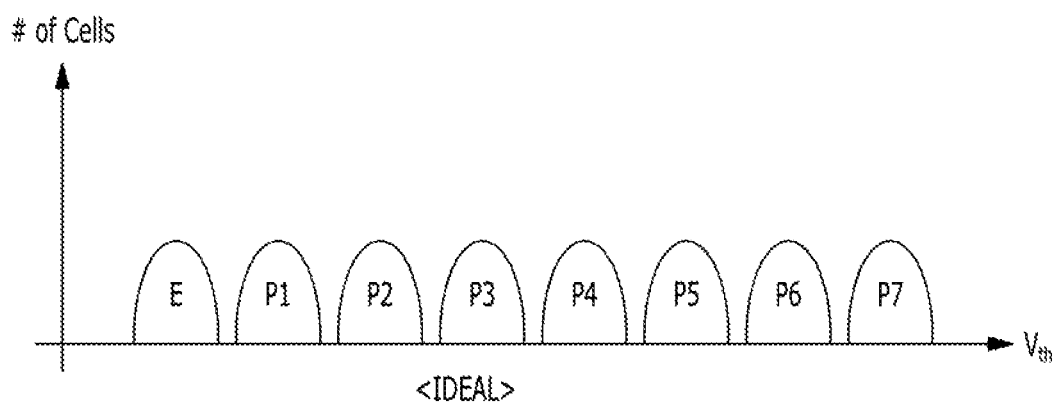
FIG. 1 is a threshold voltage distribution schematically illustrating program and erase states of a 3-bit MLC non-volatile memory device.
Figure 2:
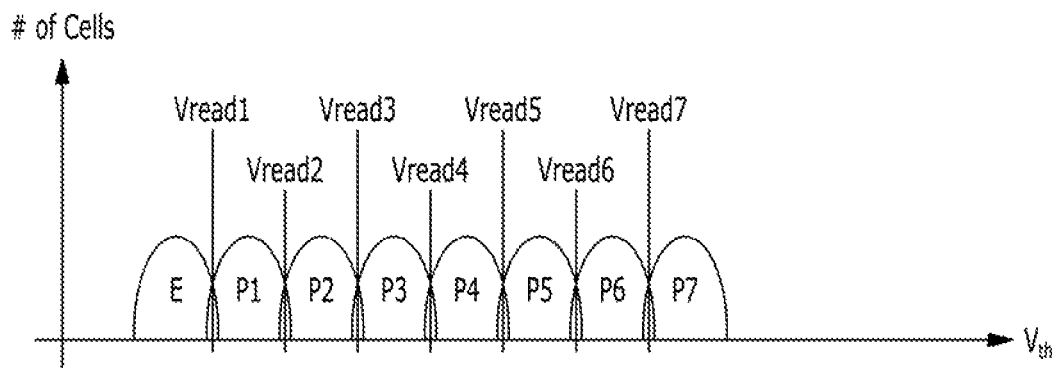
FIG. 2 is a threshold voltage distribution schematically Illustrating program and erase states due to characteristic deterioration of a 3-bit MLC non-volatile memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and, in some instances, proportions may have been exaggerated to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to where the first layer is formed directly on the second layer or the substrate but also to where a third layer exists between the first layer and the second layer or the substrate.

Figure 3:
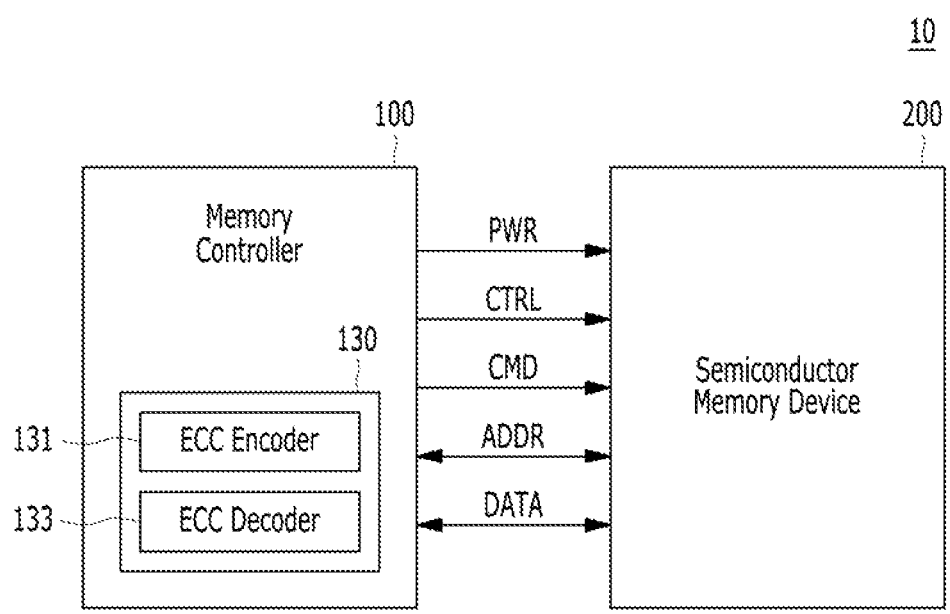
FIG. 3 is a block diagram schematically illustrating a semiconductor memory system in accordance with an embodiment of the present invention.

FIG. 3 is a block diagram schematically illustrating a semiconductor memory system 10 in accordance with an embodiment of the present invention.

Figure 4A:
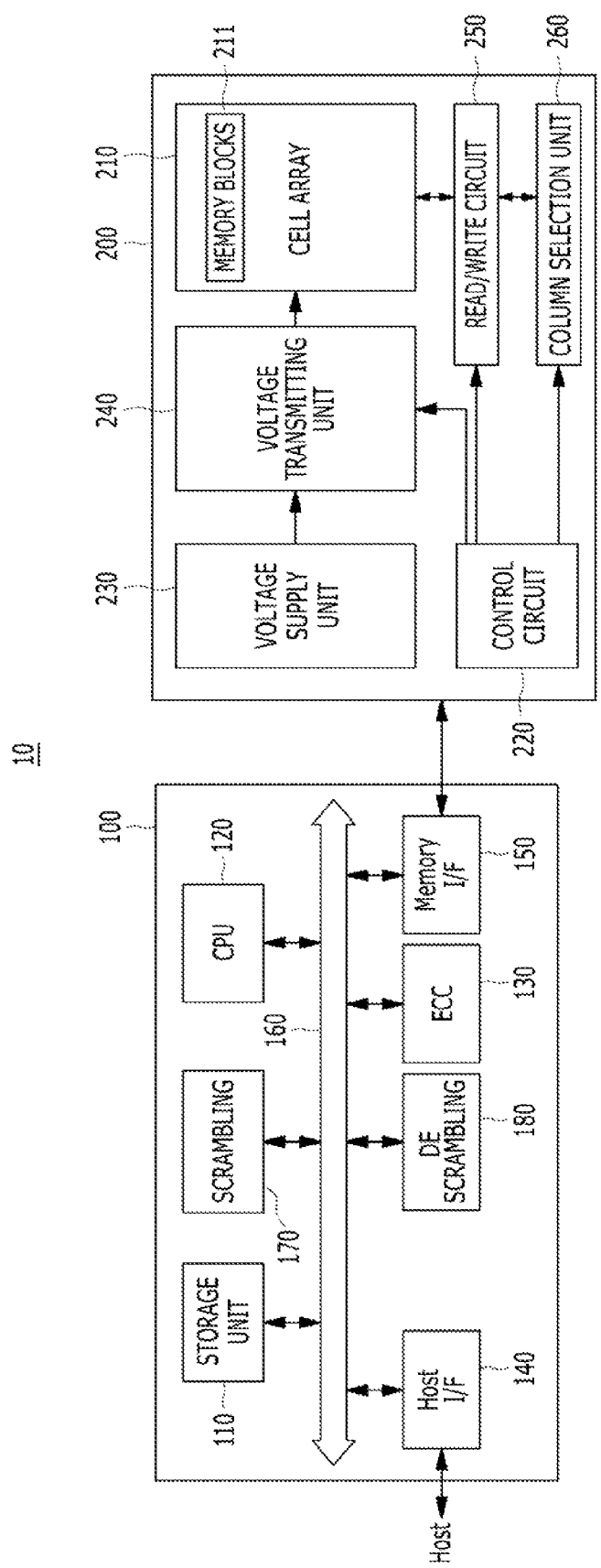
FIG. 4A is a block diagram illustrating a semiconductor memory system shown in FIG. 3.

FIG. 4A is a block diagram illustrating the semiconductor memory system 10 shown in FIG. 3.

Figure 4B:
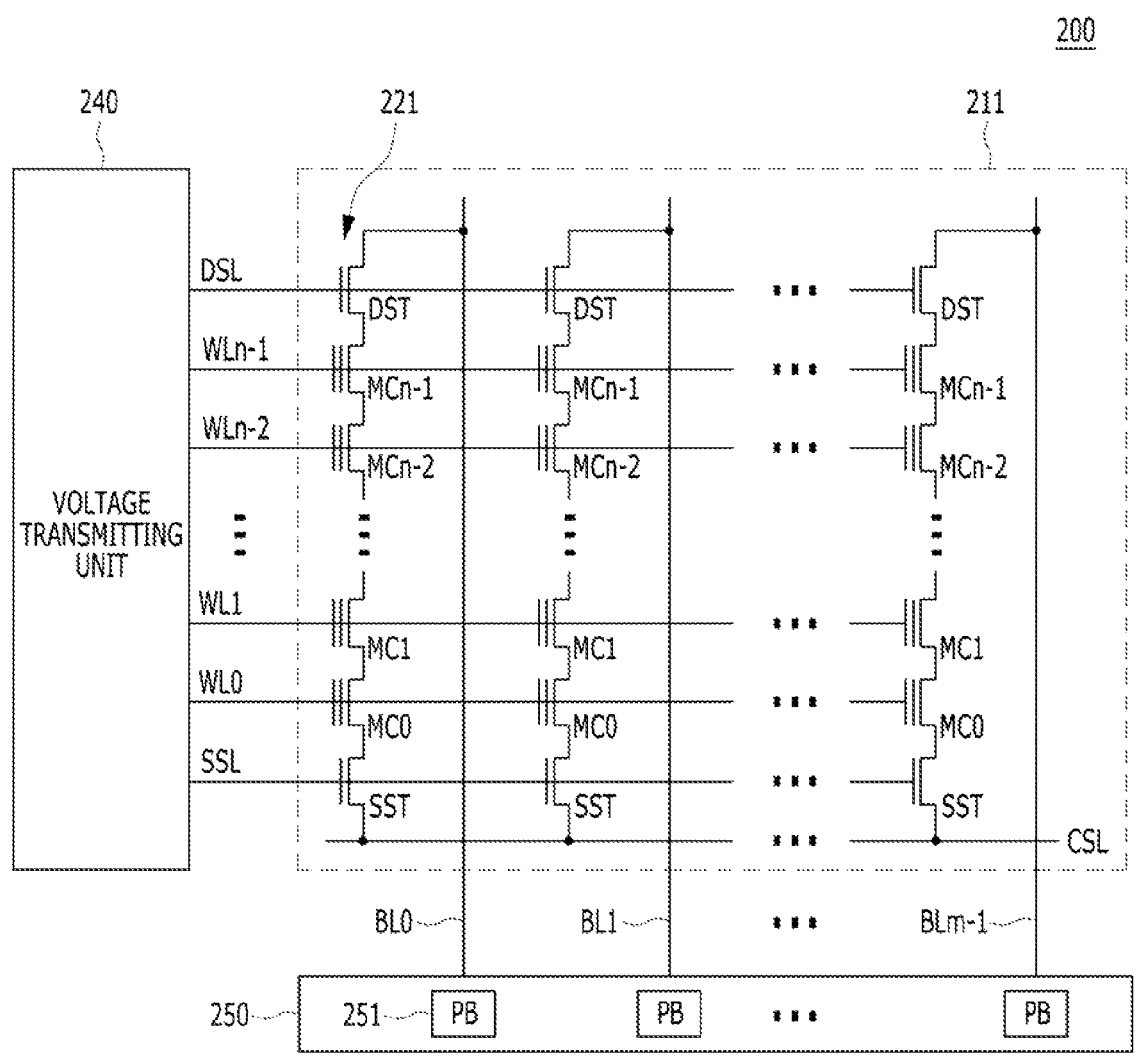
FIG. 4B is a circuit diagram illustrating a memory block shown in FIG. 4A.

FIG. 4B is a circuit diagram illustrating a memory block 211 shown in FIG. 4A.

Figure 5:
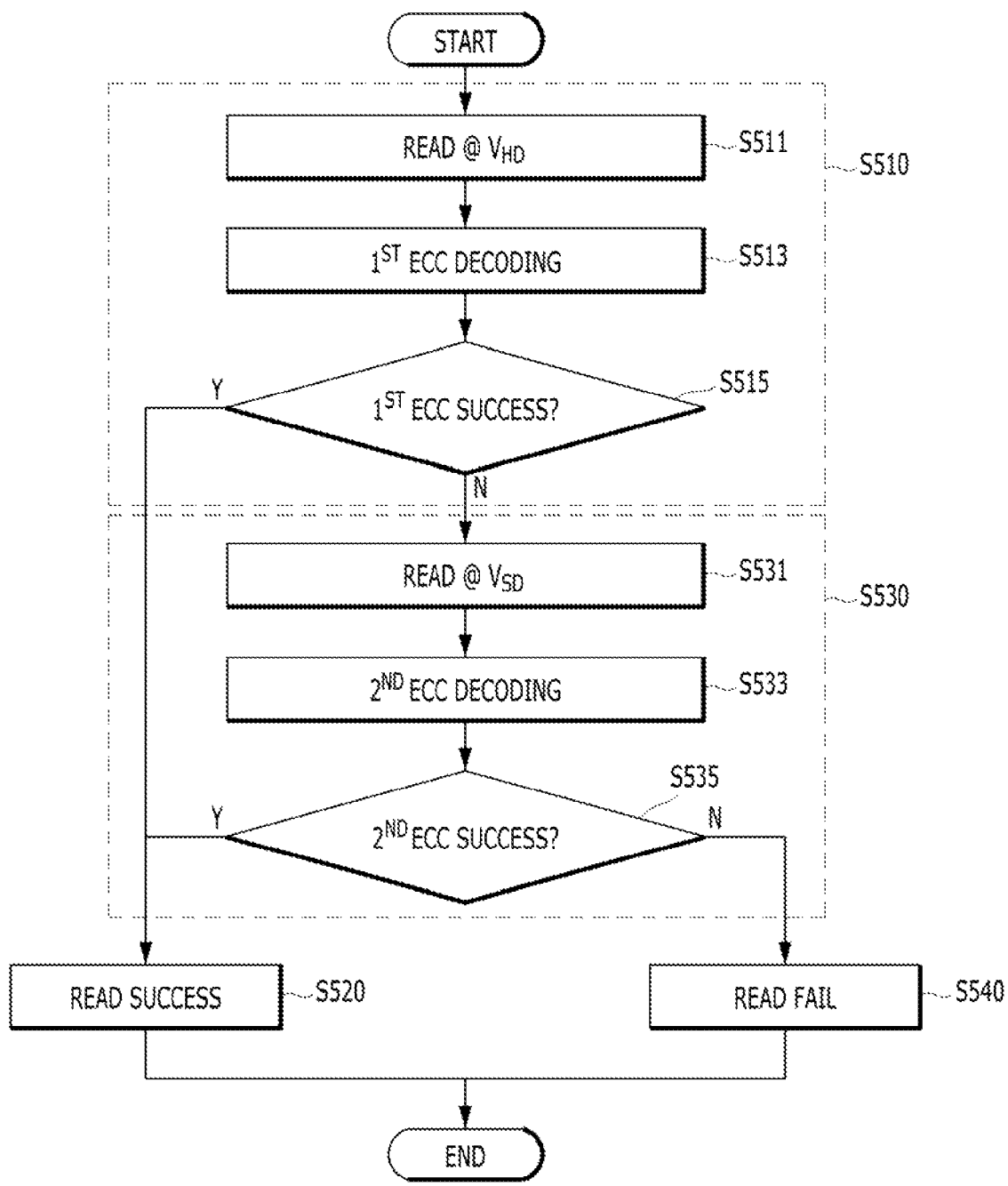
FIG. 5 is a flowchart illustrating an operation of a memory controller shown in FIG. 4A.

FIG. 5 is a flowchart Illustrating the operation of the memory controller 100 shown in FIG. 4A.

Referring to FIGS. 3 to 5, the semiconductor memory system 10 may include a semiconductor memory device 200 and the memory controller 100.

The semiconductor memory device 200 may perform one or more of erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 may control overall operations of the semiconductor memory device 200. The memory controller 100 may include an ECC unit 130 for correcting error bits. The ECC unit 130 may include an ECC encoder 131 and an ECC decoder 133.

The ECC encoder 131 may perform error correction encoding on data to be programmed into the semiconductor memory device 200 to output data to which parity bits are added. The parity bits may be stored in the semiconductor memory device 200.

The ECC decoder 133 may perform error correction decoding on data read from the semiconductor memory device 200. The ECC decoder 133 may determine whether the error correction decoding is successful, and may output an instruction signal based on the determination result. The ECC decoder 133 may correct error bits of data using the parity bits generated by the ECC encoding operation.

When the number of error bits exceeds error correction capacity of the ECC unit 130, the ECC unit 130 may not correct the error bits. In this case, the ECC unit 130 may generate an error correction fall signal.

The ECC unit 130 may correct an error through a coded modulation such as a low-density parity-check (LDPC) code, a Bose-Chaudhuri-Hocquenghem (BCH) code, a turbo code, a Reed-Solomon (RS) code, a convolution code, a Recursive Systematic Code (RSC), a Trellis-Coded Modulation (TCM), a Block Coded Modulation (BCM), and so on. The ECC unit 130 may include all circuits, systems, or devices for error correction.

In accordance with an embodiment of the present invention, the ECC unit 130 may perform an error bit correcting operation using hard decision read data and soft decision read data.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid state drive may include a storage device for storing data in a semiconductor memory. When the semiconductor memory system 10 is used in an SSD, operation speed of a host (not shown) coupled to the semiconductor memory system 10 may be remarkably improved.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the semiconductor memory system 10 may be provided as one of various elements comprising an electronic device such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or elements devices of a computing system.

Referring to FIG. 4A, the memory controller 100 may include a storage unit 110, a CPU 120, the ECC unit 130, a host interface 140, a memory interface 150, a system bus 160, a scrambling unit 170 and a de-scrambling unit 180. The storage unit 110 may operate as a working memory of the CPU 120. The scrambling unit 170 and the de-scrambling unit 180 may be implemented as a combined component even though FIG. 4A exemplarily shows the scrambling unit 170 and the de-scrambling unit 180 as independent components.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The ECC unit 130 may detect and correct errors included in the data read from the semiconductor memory device 200. The memory interface 150 may interface with the semiconductor memory device 200. The ECC encoder 131 and the ECC decoder 133 may be implemented as different and independent components even though FIG. 4A exemplarily shows the ECC unit 130 including both of the ECC encoder 131 and the ECC decoder 133. The CPU 120 may perform various control operations.

The scrambling unit 170 may change the pattern of input data so that first and second states, e.g. respective logic values of '1' and '0', of the input data are evenly distributed. Due to increased integrity of the non-volatile semiconductor memory device, Interference may increase among a plurality of memory cells of the semiconductor memory device 200. The interference may vary according to status or value of stored data of neighbouring memory cells. Therefore, the interference of the data pattern or data values of each memory cell may be minimized through normalization of the scrambled data stored in each memory cell. Even though interference such as program voltage disturbance, pass voltage disturbance, coupling between the floating poly gates, back pattern dependency, and so forth, occurs in the memory cells of the semiconductor memory device 200, it may be normalized by programming the scrambled data of the scrambling unit 170.

In accordance with an exemplary embodiment of the present invention, during the program operation, the ECC unit 130 may encode the input data, which is to be programmed to the semiconductor memory device 200, and then the scrambling unit 170 may scramble the encoded data. In such case, during the read operation, the de-scrambling unit 180 may de-scramble the scrambled data, which is stored in the semiconductor memory device 200, and then the ECC unit 130 may decode the de-scrambled data.

The de-scrambling unit 180 may de-scramble the scrambled data stored in the semiconductor memory device 200 and thus the scrambled data may be restored back to the original input data, which is data before the scrambling operation to the scrambled data by the scrambling unit 170 during the program operation.

As discussed with reference to FIG. 5, the read operation to the data stored in the semiconductor memory device 200 may include a hard decision read operation of step S511 and a soft hard decision read operation of step S531. During the hard decision read operation, data may be read from the semiconductor memory device 200 according to a hard decision read voltage $V_{HD}$. During the soft decision read operation, data may be read from the semiconductor memory device 200 according to soft decision read voltages $V_{SD}$, which have different voltages than the hard decision read voltage $V_{HD}$. For example, an additional read operation according to the soft decision read voltages $V_{SD}$ may be performed to the memory cell, which is read according to the hard decision read voltage $V_{HD}$.

The scrambled data, which is stored in the semiconductor memory device 200 and is read through the hard decision read operation, may be restored back to the original input data by the de-scrambling unit 180.

The soft decision read operation is an operation of generating the LLR, which provides the reliability of the hard decision read data read through the hard decision read operation, according to the soft decision read voltages $V_{SD}$ rather than just the read operation to data stored in the semiconductor memory device 200.

In accordance with an exemplary embodiment of the present invention, during the soft decision read operation, the de-scrambling unit 180 may de-scramble the scrambled data stored in the semiconductor memory device 200 prior to the ECC decoding operation of the ECC unit 130. As described above, in accordance with an exemplary embodiment of the present invention, during the program operation, the ECC unit 130 may encode the input data and then the scrambling unit 170 may scramble the encoded data. In such case, during the read operation, the de-scrambling unit 180 may de-scramble the scrambled data, which is stored in the semiconductor memory device 200, and then the ECC unit 130 may decode the de-scrambled data.

In accordance with an exemplary embodiment of the present invention, during the soft decision read operation, the de-scrambling unit 180 may de-scramble the scrambled data stored in the semiconductor memory device 200 prior to the ECC operation of the ECC unit 130.

In accordance with an exemplary embodiment of the present invention, during the soft decision read operation, even though the de-scrambling unit 180 de-scrambles the scrambled data prior to the ECC decoding operation of the ECC unit 130, the LLR may properly be generated.

The ECC unit 130 may perform the ECC decoding to the restored or de-scrambled LLR by the de-scrambling unit 180. The ECC unit 130 may detect and correct the error of the read data from the semiconductor memory device 200 through the de-scrambled LLR.

The semiconductor memory device 200 may include a memory cell array 210, a control circuit 220, a voltage supply unit 230, a voltage transmitting unit 240, a read/write circuit 250, and a column selection unit 260.

The memory cell array 210 may include a plurality of memory blocks 211. User data may be stored in the memory block 211.

Referring to FIG. 4B, the memory block 211 may include a plurality of cell strings 221 coupled to bit lines BL0 to BLm−1, respectively. The cell string 221 of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

FIG. 4B exemplarily illustrates a memory block 211 comprising a NAND-type flash memory cell. However, the memory block 211 of the semiconductor memory device 200 is not limited to being NAND flash memory, but may comprise NOR-type flash memory, hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operations related to program, erase, and read operations of the semiconductor memory device 200.

The voltage supply unit 230 may provide word line voltages, for example, a program voltage, a read voltage, and a pass voltage, to the respective word lines according to an operation mode, and may provide a voltage to be supplied to a bulk, for example, a well region in which the memory cells are formed. A voltage generating operation of the voltage supply circuit 230 may be performed under control of the control circuit 220.

The voltage supply unit 230 may generate a plurality of variable read voltages for generating a plurality of read data.

The voltage transmitting unit 240 may select one of the memory blocks 211 or sectors of the memory cell array 210, and may select one of the word lines of the selected memory block under the control of the control circuit 220. The voltage transmitting unit 240 may provide the word line voltage generated from the voltage supply circuit 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During the normal read operation, the column selection unit 260 may output the data read from the read/write circuit 250 to the outside, for example, to the memory controller 100, based on column address information. On the other hand, during the verification read operation, the read data may be provided to a pass/fail verification circuit (not illustrated) included in the semiconductor memory device 200, and be used for determining whether a program operation of the memory cell succeeds.

During the program operation, the read/write circuit 250 may operate as a write driver for driving the bit lines according to data to be stored in the memory cell array 210. During the program operation, the read/write circuit 250 may receive the data to be written in the memory cell array 210 from a buffer (not Illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

Referring to FIGS. 4A and 5, the operation of the memory controller 100 may include a first ECC decoding step S510, and may additionally include a second ECC decoding step S530. A target data of the first and second ECC decoding steps S510 and S530, or the data stored in the semiconductor memory device 200 may be the scrambled data that is ECC-encoded by the ECC unit 130 and then scrambled by the scrambling unit 170.

For example, the first ECC decoding step S510 may be a step of a hard decision ECC decoding for hard decision read data of predetermined length, which is read from a memory cell of the memory block 211 according to the hard decision read voltage $V_{HD}$. The first ECC decoding step S510 may include steps S511 to S515.

For example, the second ECC decoding step S530 may be a step of a soft decision ECC decoding for the hard decision read data by forming soft decision read data according to soft decision read voltages $V_{SD}$ around the hard decision read voltage $V_{HD}$ when the hard decision ECC decoding of the first ECC decoding step S510 finally fails. The second ECC decoding step S530 may include steps S531 to S535.

As described above, at step S511 of the hard decision read step, the hard decision read data may be read from the semiconductor memory device 200 according to the hard decision read voltage $V_{HD}$. The memory controller 100 may provide a read command and an address to the semiconductor memory device 200. The semiconductor memory device 200 may read the hard decision read data therefrom according to the hard decision read voltage $V_{HD}$ in response to the read command and the address. The read hard decision read data may be provided to the memory controller 100.

At step S513, the hard decision ECC decoding as the first ECC decoding may be performed. The ECC unit 130 may perform the hard decision ECC decoding to the hard decision read data, which is read from the semiconductor memory device 200 according to the hard decision read voltage $V_{HD}$ by using the error correction code.

At step S515, it may be determined whether the hard decision ECC decoding succeeds or falls. That is, at step S515, it may be determined whether an error of the hard decision read data, to which the hard decision ECC decoding is performed at step S513, is corrected. For example, the memory controller 100 may determine whether an error of the hard decision read data is corrected by using the hard decision read data and a parity check matrix. For example, when product result of the parity check matrix and the hard decision read data is a zero vector ('0'), it may be determined that the hard decision read data is corrected. On the other hand, when product result of the parity check matrix and the hard decision read data is not the zero vector ('0'), it may be determined that the hard decision read data is not corrected.

When it is determined that the hard decision read data is corrected as the result of determination of step S515, it may be determined at step S520 that the read operation according to hard decision read voltage $V_{HD}$ at step S511 is successful and the operation of the memory controller 100 may end. The hard decision read data, to which the hard decision ECC decoding is performed at step S513, may be now the error-corrected data and may be provided externally or used in the memory controller 100.

When it is determined that the hard decision read data is not corrected as the result of determination of step S515, the second ECC decoding step S530 may be performed.

As described above, at step S531 of the soft decision read step, the soft decision read data may be read from the semiconductor memory device 200 according to the soft decision read voltages $V_{SD}$. For example, the additional read operation according to the soft decision read voltages $V_{SD}$ may be performed on the memory cell, to which the first ECC decoding step S510 is performed according to the hard decision read voltage $V_{HD}$. The soft decision read voltages $V_{SD}$ may be different than the hard decision read voltage $V_{HD}$.

At step S533, the soft decision ECC decoding as the second ECC decoding may be performed. The soft decision ECC decoding may be performed based on the soft decision read data comprising the hard decision read data, to which the hard decision ECC decoding is performed, and data read from the memory cell according to the soft decision read voltages $V_{SD}$. The hard decision read voltage $V_{HD}$ and the soft decision read voltages $V_{SD}$ may be different.

For example, each of the memory cells MC0 to MCn−1 of the semiconductor memory device 200 may belong to one of the threshold voltage distributions including 7 program states P1 to P7 and 1 erase state E.

The hard decision read voltage $V_{HD}$ may have a voltage between 2 neighbouring states of the plurality of states (E and P1 to P7). Each of the soft decision read voltages $V_{SD}$ may have a voltage between 2 neighbouring states of the plurality of states (E and P1 to P7), which is different from the hard decision read voltage $V_{HD}$.

The hard decision read data read from the memory cells MC0 to MCn−1 according to the hard decision read voltage $V_{HD}$ and the soft decision read data read therefrom according to the soft decision read voltages $V_{SD}$ may have different values. For example, there may be a tailed one of the memory cells MC0 to MCn−1 having the threshold voltage higher or lower than the threshold voltage distribution of the normal logic state. The hard decision read data read from the tailed memory cell according to the hard decision read voltage $V_{HD}$ and the soft decision read data read therefrom according to the soft decision read voltages $V_{SD}$ may have different values. When the additional read operation according to the soft decision read voltages $V_{SD}$ is performed as well as the read operation according to the hard decision read voltage $V_{HD}$, additional information on the threshold voltages of the memory cells MC0 to MCn−1 (i.e., additional information on the tailed memory cells) or the log likelihood ratio (LLR) providing reliability of the hard decision read data read by the hard decision read operation may be obtained.

When the additional information is obtained, the probability of the likelihood ratio whether the data of the memory cells MC0 to MCn−1 belong to the first state (i.e., '1'), or the second state (i.e., '0'), may increase. That is, the reliability of the ECC decoding may increase. The memory controller 100 may perform the soft decision ECC decoding based on the soft decision read data, which is read according to the hard decision read voltage $V_{HD}$ and the soft decision read voltages $V_{SD}$. The relationship between the hard decision read voltage $V_{HD}$ and the soft decision read voltages $V_{SD}$ will be disclosed with reference to FIGS. 7A and 7B.

At step S535, it may be determined whether the soft decision ECC decoding succeeds or fails. That is, at step S535, it may be determined whether an error of the soft decision read data, to which the soft decision ECC decoding is performed at step S533, is corrected. For example, the memory controller 100 may determine whether an error of the soft decision read data is corrected by using the soft decision read data and the parity check matrix. For example, when product result of the parity check matrix and the soft decision read data is the zero vector ('0'), it may be determined that the soft decision read data, to which the soft decision ECC decoding is performed, is corrected. On the other hand, when product result of the parity check matrix and the soft decision read data is not the zero vector ('0'),
it may be determined that the soft decision read data, to which the soft decision ECC decoding is performed, is not corrected.

The product process of the parity check matrix and the hard decision read data during the first ECC decoding step S510 may be the same as the product process of the parity check matrix and the soft decision read data during the second ECC decoding step S530.

When it is determined that the soft decision read data is corrected as the result of determination of step S535, it may be determined at step S520 that the read operation according to soft decision read voltage $V_{SD}$ at step S531 is successful and the operation of the memory controller 100 may end. The soft decision read data, to which the soft decision ECC decoding is performed at step S533, may be now the error-corrected data and may be provided externally or used in the memory controller 100.

When it is determined that the soft decision read data is not corrected as the result of determination of step S535, it may be determined at step S540 that the read operation of the memory controller 100 to the memory cells MC0 to MCn−1 finally fails and the operation of the memory controller 100 may end.

Figure 6A:
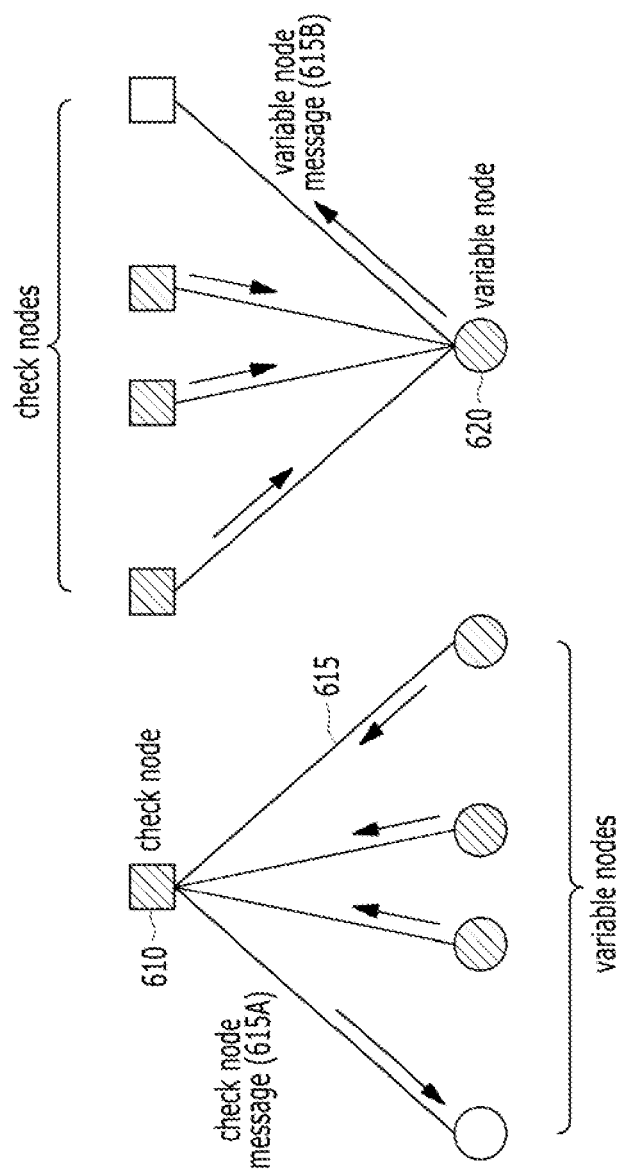
FIG. 6A is a schematic diagram illustrating LDPC decoding represented by a tanner graph.

FIG. 6A is a schematic diagram illustrating LDPC decoding represented by a tanner graph.

Figures 6B, 6C:
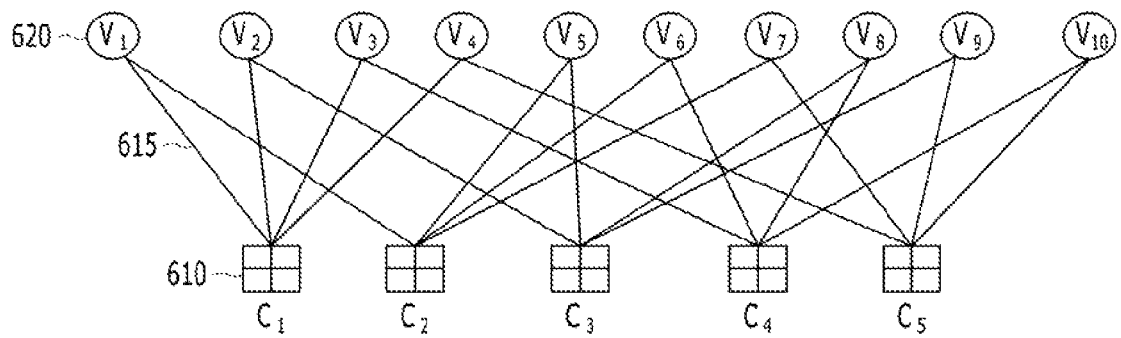
FIG. 6B is a schematic diagram illustrating an LDPC code.
FIG. 6C is a schematic diagram illustrating a syndrome check process according to LDPC decoding.

FIG. 6B is a schematic diagram illustrating an LDPC code.

FIG. 6C is a schematic diagram illustrating a syndrome check process according to the LDPC decoding.

An error correction code (ECC) is commonly used in storage systems. Various physical phenomena occurring in storage devices result in noise effects that corrupt the stored information. Error correction coding schemes can be used for protecting the stored information against the resulting errors. This is done by encoding the information before storing the information in the memory device. The encoding process transforms the information bit sequence into a codeword by adding redundancy to the information. This redundancy can then be used in order to recover the information from the possibly corrupted codeword through a decoding process.

In iterative coding schemes, the code is constructed as a concatenation of several simple constituent codes and is decoded based on an iterative decoding algorithm by exchanging information between decoders receiving the simple constituent codes. Usually, the code can be defined using a bipartite graph or a tanner graph describing interconnections between the constituent codes. In this case, decoding can be viewed as an iterative message passing over the graph edges.

The iterative codes may include the low-density parity-check (LDPC) code. The LDPC code is a linear binary block code defined by a sparse parity-check matrix H.

Referring to FIG. 6A, the LDPC code has a parity check matrix in which the number of is in each row and column is very small, and its structure can be defined by the tanner graph including check nodes 610, variable nodes 620, and edges 615 connecting the check nodes 610 to the variable nodes 620. A value delivered from the check node 610 to the variable node 620 after check node processing becomes a check node message 615A, and a value delivered from the variable node 620 to the check node 610 after variable node processing becomes a variable node message 615B.

A decoding process of the LDPC code is performed by iterative decoding based on a 'sum-product' algorithm. A decoding method can be provided based on a suboptimal message-passing algorithm such as a 'min-sum' algorithm, which is a simplified version of the sum-product algorithm.

For example, referring to FIG. 6B, the tanner graph of the LDPC code includes 5 check nodes 610 representing parity check equations of the LDPC code, 10 variable nodes 620 representing code symbols, and edges 615 representing relationships between the check nodes 610 and the variable nodes 620. The edges 615 connect each check node 610 to the variable node 620 corresponding to a code symbol included in the parity check equations represented by the check nodes 610. FIG. 6B exemplarily illustrates a regular LDPC code in which the number of variable nodes 620 coupled to each of the check nodes 610 is fixed at 4 and the number of the check nodes 200 coupled to each of the variable nodes 620 is fixed at 2. An initial value of the variable node 620 may be one of the hard decision read data and the soft decision read data.

FIG. 6C shows a parity check matrix H corresponding to the tanner graph. The parity check matrix H is similar to the graphic expression of the parity check equations. The parity check matrix H has the same number of Is in each column and each row. That is, each column of the parity check matrix H has two is corresponding to the connections between each of the variable nodes 620 and the check nodes 610, and each row has four is corresponding to the connections between each of the check nodes 610 and the variable nodes 620.

A process of decoding the LDPC code is performed by iterating a process of exchanging messages, which are generated and updated in each node, between the variable nodes 620 and the check nodes 610 in the tanner graph. In this case, each node updates the messages based on the sum-product algorithm or a similar suboptimal algorithm.

For example, the LDPC decoding on the hard decision read data may comprise a plurality of iterations, each of which includes update of the check nodes 610 after an initial update of the variable nodes 620, update of the variable nodes 620, and a syndrome check. After the single iteration, when the result of the syndrome check satisfies a predetermined condition, the LDPC decoding may end. When the result of the syndrome check does not satisfy the predetermined condition, another single iteration may be performed on the memory cell of the memory block 211 according to a second hard decision read voltage $V_{HD}$ different from the first hard decision read voltage $V_{HD}$. The number of iterations may be limited to a maximum read count. When the result of the syndrome check does not satisfy the predetermined condition until the number of iterations reaches the maximum read count, the LDPC decoding on the data may be determined to have failed in ECC decoding.

Referring to FIG. 6C, the syndrome check is a process of identifying whether the product result "$\underline{v}$" of the parity check matrix H and a vector "y", which is obtained by the update of the variable nodes 620, satisfies the predetermined condition. When the product result "$H\underline{v}^t$" becomes the zero vector, the product result "$H\underline{v}^t$" may be evaluated to satisfy the predetermined condition.

FIG. 6C shows the syndrome check process. FIG. 6C exemplarily shows a non-zero vector "01000" as the product result "$H\underline{v}^t$", and thus FIG. 6C shows that the syndrome check does not satisfy the predetermined condition and another single iteration should be performed according to another hard decision read voltage $V_{HD}$.

Considering the non-zero vector "01000" as the product result "$H\underline{v}^t$", the number of non-zero vector elements or elements, which do not meet the zero vector condition, is 1. In the description, the elements that do not meet the zero vector condition of the syndrome check for the product result "$H\underline{v}^t$" in the single iteration is defined as unsatisfied syndrome check (USC). FIG. 6C shows the result of the syndrome check where the number of the USC is 1.

Figure 7A:
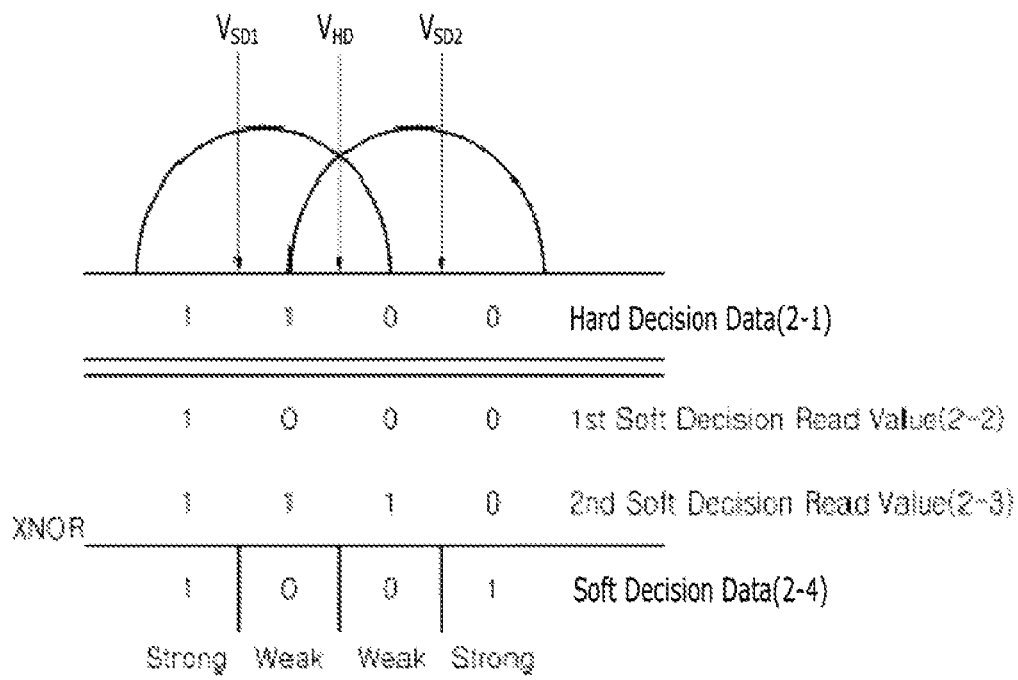
FIGS. 7A and 7B are schematic diagrams illustrating a soft decision read operation shown in FIG. 5.
Figure 7B:
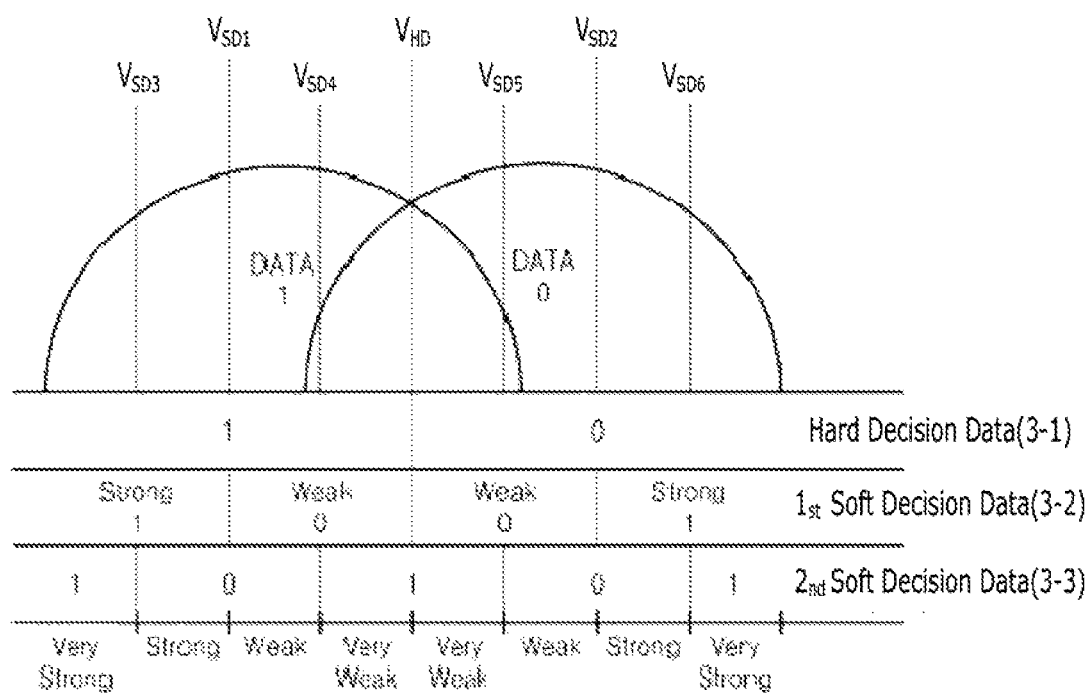

FIGS. 7A and 7B are schematic diagrams illustrating the soft decision read operation shown in FIG. 5, particularly 2-bit and 3-bit soft decision read operations, respectively.

Referring to FIG. 7A, during the first ECC decoding operation of step S510 described with reference to FIG. 5, the hard decision read data 2-1 may have one of values '1' and '0' according to the on/off state of the memory cell when the hard decision read voltage $V_{HD}$ is applied to the semiconductor memory device 200.

During the second ECC decoding operation of step S530, the LLR may be generated through the soft decision read operation where the soft decision read voltages $V_{SD1}$ and $V_{SD2}$, which have different voltages from the hard decision read voltage $V_{HD}$, are applied to the memory cell.

Referring to FIG. 7A, during the 2-bit soft decision read operation, a first soft decision read value 2-2 may be '1000' according to the on/off status of a memory cell when the first soft decision read voltage $V_{SD1}$ is applied to the memory cell. In a similar way, a second soft decision read value 2-3 may be '1110' according to the on/off status of the memory cell when the second soft decision read voltages $V_{SD2}$ is applied to the memory cell.

For example, the ECC unit 130 may generate a soft decision read data 2-4 or the LLR through the XNOR operation to the first and second soft decision read values 2-2 and 2-3. The LLR 2-4 may show reliability of the hard decision read data 2-1.

For example, the value '1' of the soft decision read data 2-4 may show a "strong" probability of the first and second statuses (the logic values of '1' and '0') of the hard decision read data 2-1. On the other hand, the value '0' of the soft decision read data 2-4 may show a "weak" probability of the first and second statuses of the hard decision read data 2-1.

Referring to FIG. 7B, during the first ECC decoding operation of step S510 described with reference to FIG. 5, the hard decision read data 3-1 may have one of values '1' and '0' according to the on/off state of the memory cell when the hard decision read voltage $V_{HD}$ is applied to the semiconductor memory device 200.

During the second ECC decoding operation of step S530, the LLR may be generated through the soft decision read operation where the soft decision read voltages $V_{SD1}$ to $V_{SD6}$, which have different voltages from the hard decision read voltage $V_{Hd}$, are applied to the memory cell.

Referring to FIG. 7B, during the 3-bit soft decision read operation, first and second soft decision read values may be generated according to the on/off status of a memory cell when first and second soft decision read voltages $V_{SD1}$ and $V_{SD2}$ are applied to the memory cell, which is similar to the 2-bit soft decision read operation described with reference to FIG. 7A. The ECC unit 130 may generate a first soft decision read data 3-2 '1001' or the LLR through the XNOR operation to the first and second soft decision read values.

In a similar way, during the 3-bit soft decision read operation, third to sixth soft decision read values may be generated according to the on/off status of the memory cell when third to sixth soft decision read voltages $V_{SD3}$ to $V_{SD6}$, which have different voltages from the first and second soft decision read voltages $V_{SD1}$ and $V_{SD2}$ are applied to the memory cell, which is similar to the 2-bit soft decision read operation described with reference to FIG. 7A. The ECC unit 130 may generate a second soft decision read data 3-3 ('10101') or the LLR through the XNOR operation to the third to sixth soft decision read values. The LLR 3-3 ('10101') may provide a weighted value to the first soft decision read data 3-2.

For example, the value '1' of the second soft decision read data 3-3 may show a "very strong" probability of the first status (the logic value of '1') of the first soft decision read data 3-2. On the other hand, the value '0' of the second soft decision read data 3-3 may show a "strong" probability of the first status of the first soft decision read data 3-2.

In a similar way, the value '1' of the second soft decision read data 3-3 may show a "very weak" probability of the second status (the logic value of '0') of the first soft decision read data 3-2. On the other hand, the value '0' of the second soft decision read data 3-3 may show a "weak" probability of the second status of the first soft decision read data 3-2. The LLR 3-3 may provide a better reliability to the hard decision read data 3-1, which is similar to the 2-bit soft decision read operation described with reference to FIG. 7A.

Figure 8A:
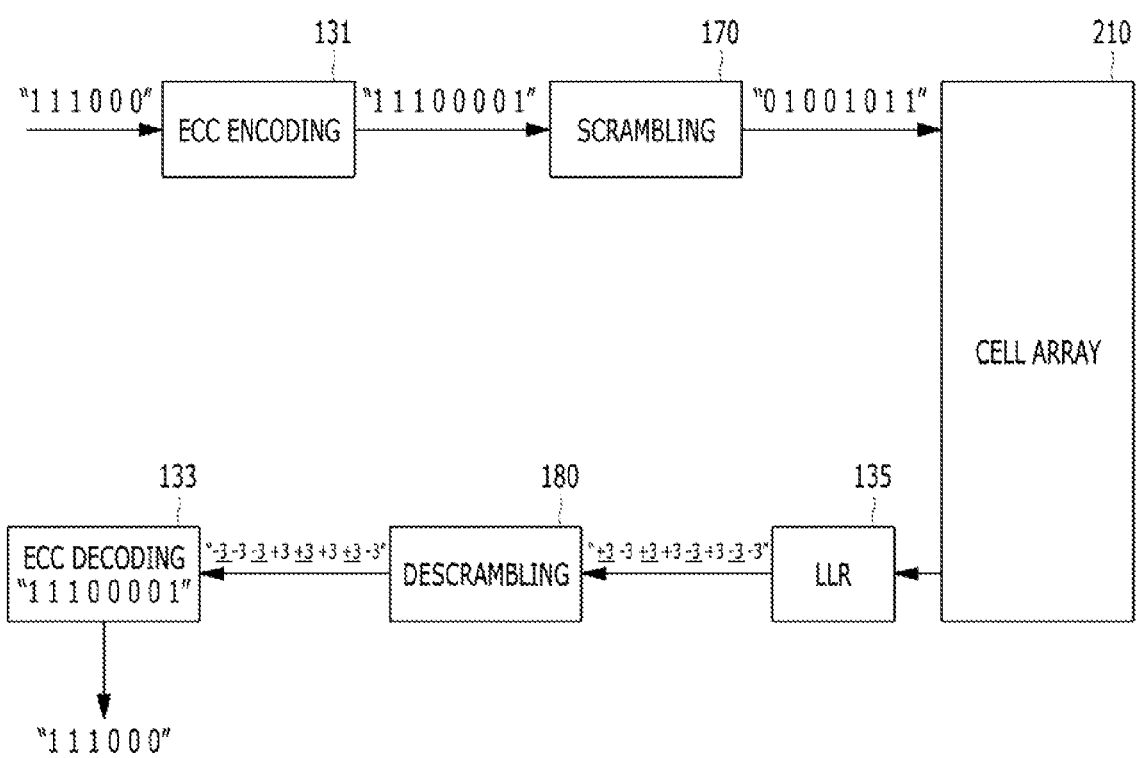
FIG. 8A is a schematic diagram illustrating an operation of a memory controller in accordance with an embodiment of the present invention.

FIG. 8A is a schematic diagram illustrating the operation of the memory controller 100 in accordance with an embodiment of the present invention.

FIG. 8A shows in detail the semiconductor memory system 100 described with reference to FIGS. 3 to 5.

Referring to FIGS. 3, 4A and 8A, in accordance with an exemplary embodiment of the present invention, during the program operation having a process flow of the ECC encoder 131, the scrambling unit 170 and the cell array 210, the ECC encoder 131 may encode the input data, which is to be programmed to the semiconductor memory device 200, and then the scrambling unit 170 may scramble the encoded data. In such case, during the read operation having a process flow of the cell array 210, a LLR generation unit 135, the de-scrambling unit 180 and the ECC decoder 133, the de-scrambling unit 180 may de-scramble the scrambled data, which is stored in the semiconductor memory device 200, and then the ECC decoder 133 may decode the de-scrambled data.

The LLR generation unit 135 may be included in the memory controller 100, and may generate the LLR 2-4 and 3-3 described with reference to FIGS. 7A and 7B. The semiconductor memory device 200 may store the scrambled data. In accordance with an exemplary embodiment of the present invention, during the read operation, the de-scrambling unit 180 may de-scramble the LLR, which is generated by the LLR generation unit 135, of the scrambled data. After the de-scrambling, the ECC decoder 133 may perform the ECC decoding to the de-scrambled data.

Referring to FIG. 8A, the ECC encoder 131 may perform the ECC encoding operation to the data input through the host interface 140, and may generate data having one or more parity bits. For example, when the ECC encoder 131 generates the parity bits for each of even-ordered values and odd-ordered values of the input data '111000', the ECC encoder 131 may generate the encoded data '11100001' having the parity bit of '0' for the odd-ordered values and of '1' for the even-ordered values of the input data '111000' by performing the XOR operation sequentially to the odd-ordered values and sequentially to the even-ordered values of the input data '111000'. The encoded data '11100001' may be input to the scrambling unit 170.

Referring to FIG. 8A, the scrambling unit 170 may change the pattern of the input data so that first and second states, e.g. respective logic values of '1' and '0', of the input data are evenly distributed. For example, when the scrambling unit 170 may perform the scrambling operation by flipping odd-ordered values of the encoded data '11100001', the scrambling unit 170 may generate the scrambled data '01001011' based on the encoded data '11100001'. The scrambled data '01001011' may be programmed to the cell array 210 of the semiconductor memory device 200.

Referring to FIG. 8A, the LLR generation unit 135 may generate the LLR 2-4 and 3-3 of the scrambled data stored in the cell array 210, as described with reference to FIGS. 7A and 7B. For example, when the LLR generation unit 135 generates 3-bit LLR having a value range from '-3' to '+3' through the 3-bit soft decision read operation without an error, the LLR generation unit 135 may generate the LLR '+3-3+3+3-3+3-3-3' for the scrambled data '01001011' stored in the cell array 210. For example, when the LLR generation unit 135 generates 3-bit LLR having a value range from '-3' to '+3' through the 3-bit soft decision read operation without an error, the bit magnitude '3' of the LLR may represent a "very strong" probability of the first and second statuses of each bit of the scrambled data '01001011'. The LLR '+3-3+3+3-3+3-3-3' may be input to the de-scrambling unit 180.

Each sign and magnitude of the LLR generated by the LLR generation unit 135 may depend on various factors including the status of the scrambled data stored in the cell array 210, the error of the soft decision read values, and so forth. For a clearer description, this patent document discloses an example in which the LLR generation unit 135 generates the LLR without an error for the scrambled data having a "very strong" probability of a predetermined status.

Referring to FIG. 8A, the de-scrambling unit 180 may de-scramble the LLR '+3-3+3+3-3+3-3-3' generated by the LLR generation unit 135. In accordance with an exemplary embodiment of the present invention, the de-scrambling unit 180 may de-scramble only the sign bit of the LLR generated by the LLR generation unit 135. For example, in correspondence with the scrambling unit 170 scrambling the encoded data '11100001' encoded by the ECC encoder 131 by flipping the odd-ordered values, the de-scrambling unit 180 may generate de-scrambled data '-3-3-3+3+3+3+3-3' through the de-scrambling by flipping only the sign bits of the odd-ordered values of the LLR '+3-3+3+3-3+3-3-3'.

In accordance with an exemplary embodiment of the present invention, the memory controller 100 may precisely read the data stored in the semiconductor memory device 200 by de-scrambling only the sign bits of the LLR generated by the LLR generation unit 135 and then performing the ECC decoding to the de-scrambled data. It is a basic premise for de-scrambling only the sign bits of the LLR and then performing the ECC decoding to the de-scrambled data that the cell array 210 of the semiconductor memory device 200 has a characteristic of the Additive White Gaussian Noise (AWGN) channel and the ECC encoder 131 and the ECC decoder 133 may perform the ECC encoding and decoding operations in accordance with the AWGN-channel-based ECC algorithm. Most of ECC encoder and decoder adopt the AWGN-channel-based ECC algorithm. The AWGN channel has completely bilateral symmetry, and thus it is not the magnitude bits but the sign bits of data stored in a memory cell or relative location of the memory cell in the threshold distribution that are variable according to the scrambling and the de-scrambling of the data stored in the cell array 210. Therefore, in accordance with an exemplary embodiment of the present invention, the memory controller 100 may precisely read the data stored in the semiconductor memory device 200 by de-scrambling only the sign bits of the LLR and then performing the ECC decoding to the de-scrambled data.

Referring to FIG. 8A, the ECC decoder 133 may perform the ECC decoding to the de-scrambled data '-3-3-3+3+3+

3+3−3' de-scrambled by the de-scrambling unit 180 and may generate codeword '11100001' corresponding to the de-scrambled data '−3−3−3+3+3+3+3−3'. The ECC decoder 133 may detect and correct the error included in the codeword '11100001'. Therefore, with no error in the codeword '11100001', the ECC decoder 133 may generate the original data '111000', which has been input to the ECC encoder 131.

Referring to FIG. 8A, the operations of the LLR generation unit 135 and the de-scrambling unit 180 may be performed during the soft decision read operation of step S531 described with reference to FIG. 5, and the operation of the ECC decoder 133 may be performed during the step S533.

Figure 8B:
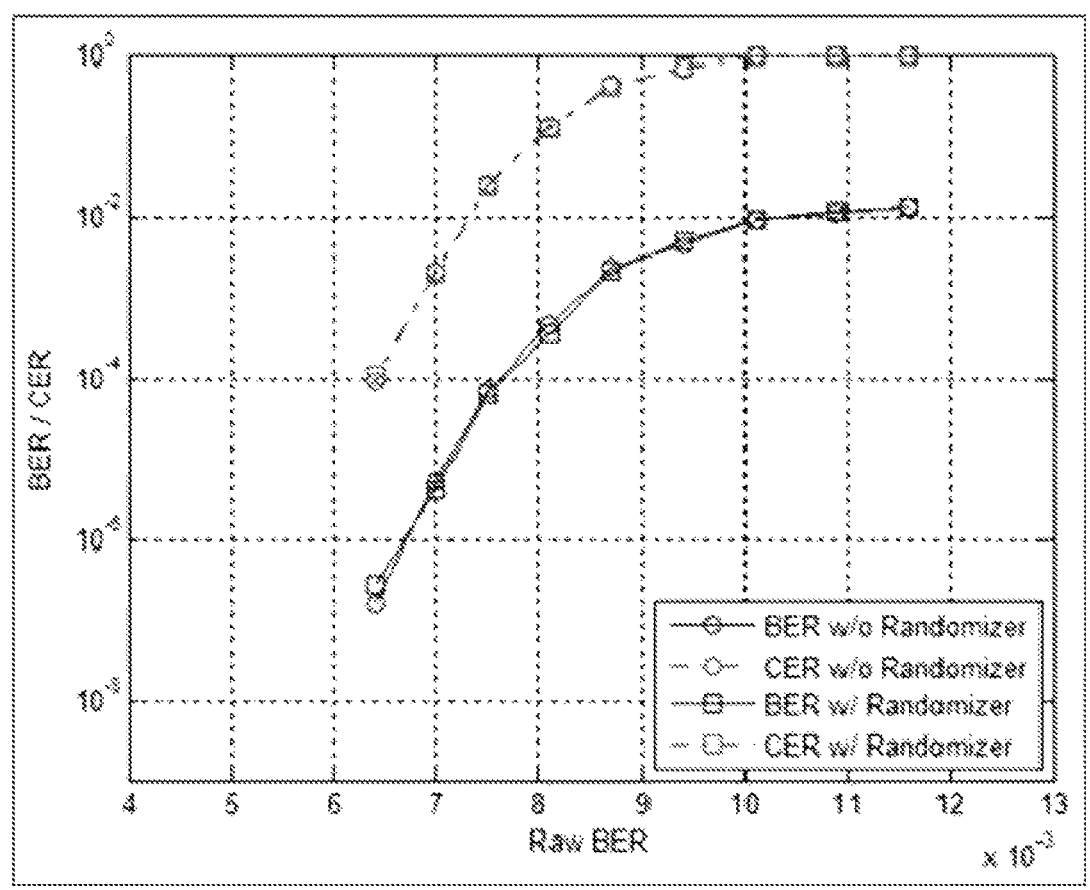
FIG. 8B is a simulation graph illustrating an operation of a memory controller in accordance with an embodiment of the present invention.

FIG. 8B is a simulation graph Illustrating the operation of the memory controller 100 in accordance with an embodiment of the present invention.

FIG. 8B shows the bit error rate (BER) and the chunk error rate (CER) according to the raw bit error rate (RBER) of the cell array 210 of the NAND flash memory device as an example of the semiconductor memory device 200 having the AWGN channel characteristics. FIG. 8B shows the BERs and CERs according to a prior art ("w/o Randomizer") and an exemplary embodiment of the present invention ("w/Randomizer"). Referring to FIG. 8B, there is no difference in the performance between the memory controllers of the prior art and the exemplary embodiment of the present invention. According to the prior art, during the program operation having a process flow of a scrambling unit, an ECC encoder, and a cell array, the scrambling unit scrambles the input data, which is to be programmed to the cell array, and then the ECC encoder performs the ECC encoding operation to the scrambled data. In such case, during the read operation having a process flow of the cell array, an ECC decoder, and a de-scrambling unit, the ECC decoder performs the ECC decoding operation to the encoded data, which is stored in the cell array, and then the de-scrambling unit decodes the ECC-decoded data. The process flows of the prior art and an exemplary embodiment of the present invention are different from each other.

In accordance with an exemplary embodiment of the present invention, the memory controller 100 may precisely read the data stored in the semiconductor memory device 200 by de-scrambling the sign bits of the LLR generated from the cell array and then performing the ECC decoding to the de-scrambled data. Therefore, bandwidth increase of the ECC encoder due to the garbage collection operation of the semiconductor memory device may be minimized. Also, data randomness may be improved since the ECC parity bits are also scrambled. Further, a single-bit-based scrambling unit and de-scrambling unit may be utilized, which means a reduction of overall number of gates and power consumption with a minimal number of components.

Figure 9:
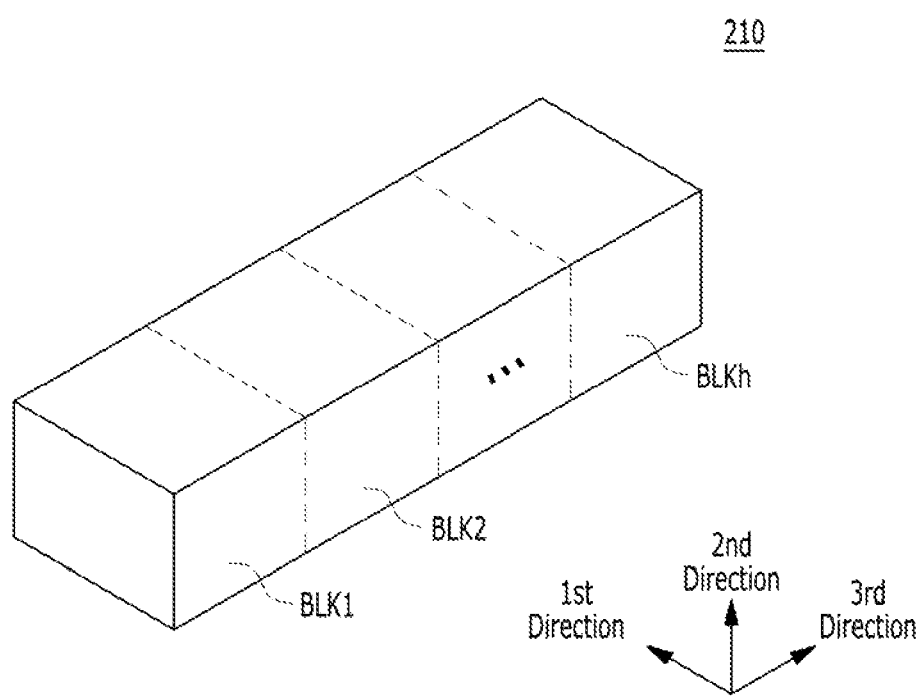
FIGS. 9 to 13 are diagrams schematically illustrating a 3D non-volatile memory device in accordance with an embodiment of the present invention.

FIG. 9 is a block diagram of the memory cell array 210 shown in FIG. 4B.

Referring to FIG. 9, the memory cell array 210 may include a plurality of memory blocks BLK1 to BLKh. Each of the memory blocks BLK1 to BLKh may have a 3D structure or a vertical structure. For example, each of the plural memory blocks BLK1 to BLKh may include a structure extending along first to third directions.

Each of the memory blocks BLK1 to BLKh may include a plurality of NAND strings NS extending along the second direction. A plurality of NAND strings NS may be provided along the first and third directions. Each of the NAND strings NS may be coupled to a bit line BL, one or more string select lines SSL, one or more ground select lines GSL, a plurality of word lines WL, one or more dummy word lines DWL, and a common source line CSL. That is, each of the memory blocks BLK1 to BLKh may be coupled to a plurality of bit lines BL, a plurality of string select lines SSL, a plurality of ground select lines GSL, a plurality of word lines WL, a plurality of dummy word lines DWL, and a plurality of common source lines CSL.

Figure 10:
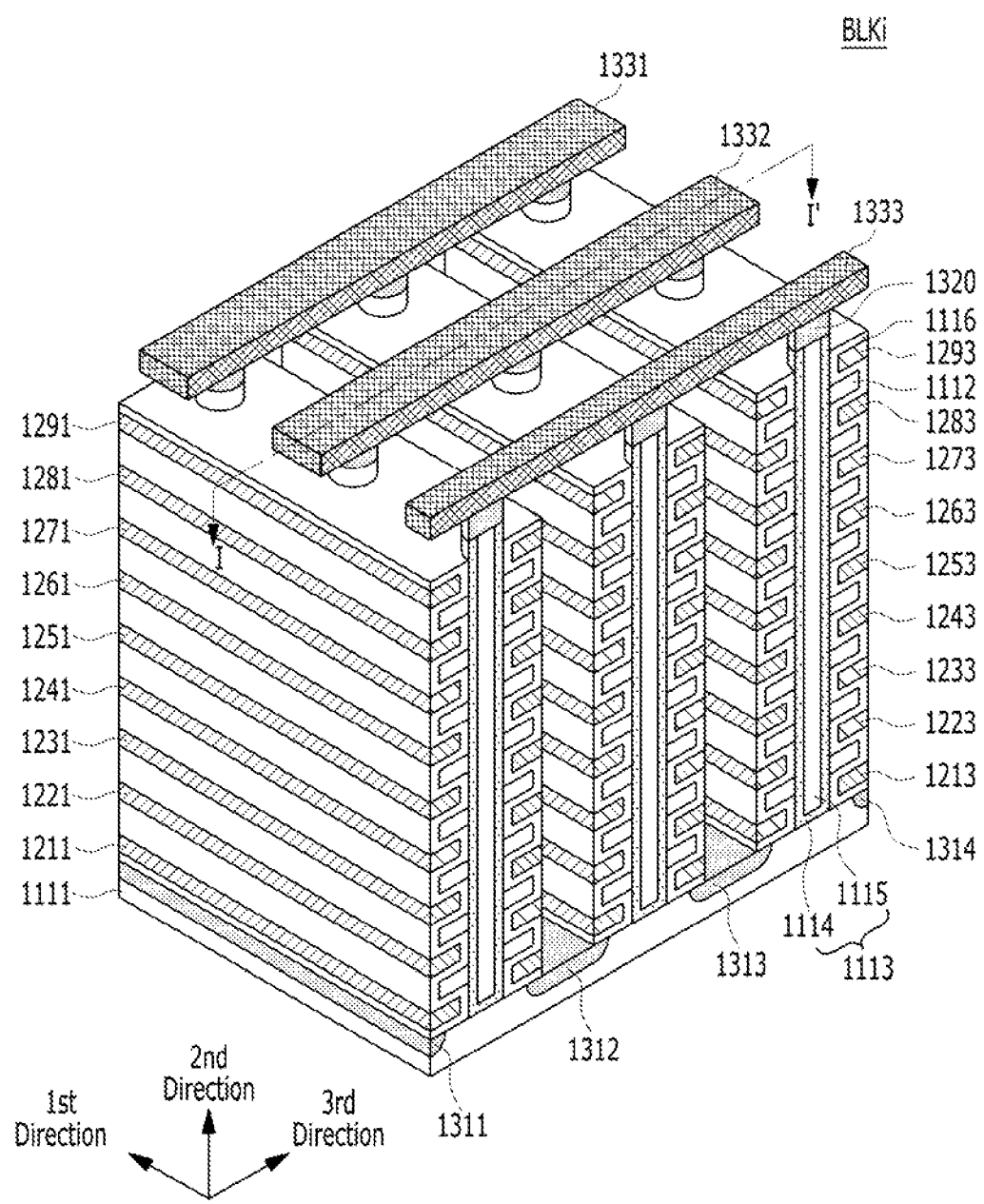
Figure 11:
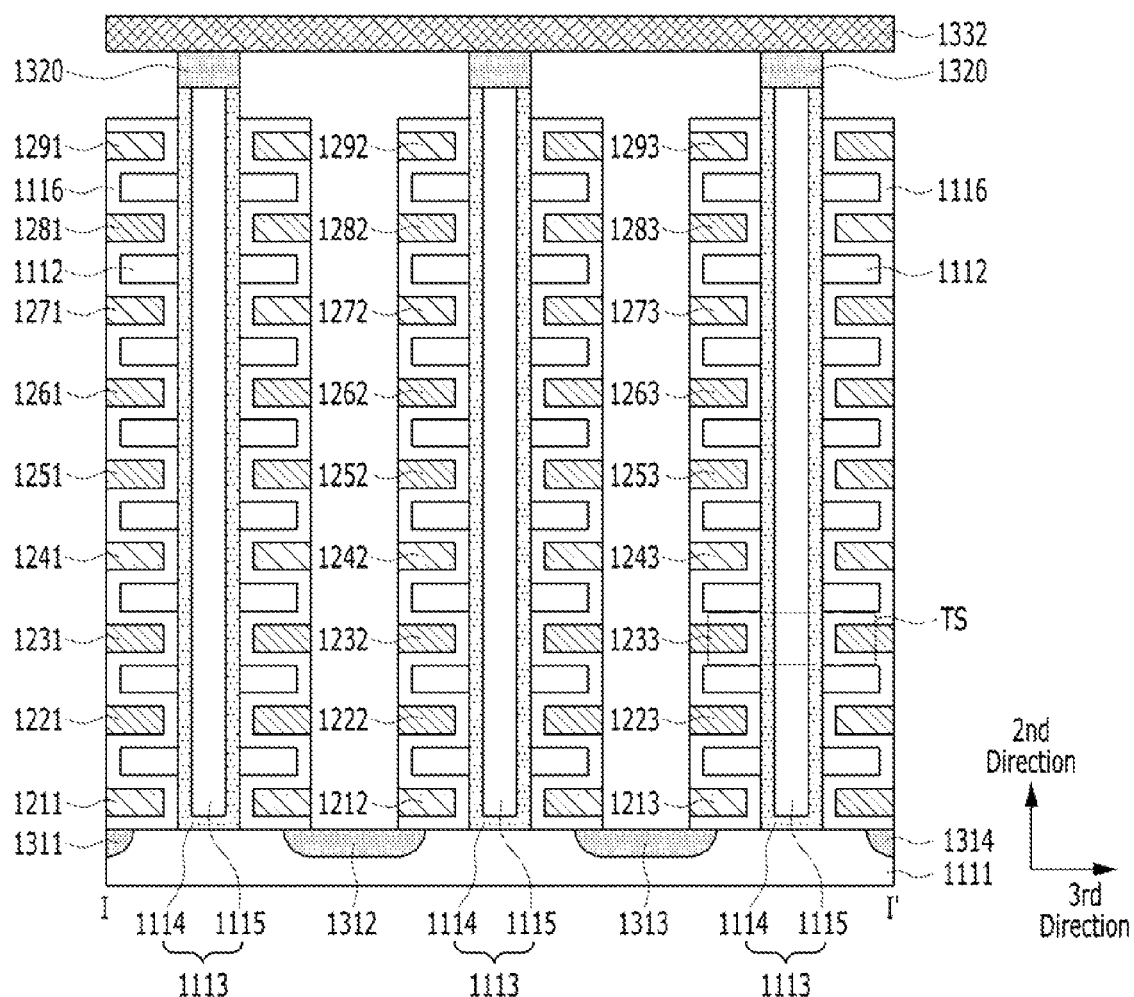

FIG. 10 is a perspective view of one memory block BLKi of the memory blocks BLK1 to BLKh shown in FIG. 9. FIG. 11 is a cross-sectional view taken along a line I-I' of the memory block BLKi shown in FIG. 10.

Referring to FIGS. 10 and 11, the memory block BLKi may Include a structure extending along first to third directions.

A substrate 1111 may be provided. For example, the substrate 1111 may include a silicon material doped by a first type impurity. For example, the substrate 1111 may include a silicon material doped by a p-type impurity or a p-type well, e.g., a pocket p-well. The substrate 1111 may further include an n-type well surrounding the p-type well. In the description, it is exemplarily assumed that the substrate 1111 is p-type silicon. However, the substrate 1111 is not limited to being p-type silicon.

A plurality of doping regions 1311 to 1314 extending along the first direction may be provided over the substrate 1111. For example, the plurality of doping regions 1311 to 1314 may have a second type impurity differing from that of the substrate 1111. For example, the plurality of doping regions 1311 to 1314 may be doped with an n-type impurity. In the description, it is exemplarily assumed that the first to fourth doping regions 1311 to 1314 are n-type. However, the first to fourth doping regions 1311 to 1314 are not limited to being n-type.

A plurality of insulation materials 1112 extending along the first direction may be sequentially provided along the second direction over a region of the substrate 1111 between the first and second doping regions 1311 and 1312. For example, the plurality of insulation materials 1112 and the substrate 1111 may be spaced apart by a predetermined distance in the second direction. In a second example, the plurality of insulation materials 1112 may be spaced apart from each other in the second direction. In a third example, the insulation materials 1112 may include an insulator such as silicon oxide.

A plurality of pillars 1113 may be sequentially provided along the first direction over a region of the substrate 111 between the first doping region 1311 and the second doping region 1312, and may be formed to penetrate the insulation materials 1112 along the second direction. For example, each of the plurality of pillars 1113 may penetrate the insulation materials 1112 to contact the substrate 1111. For example, each of the pillars 1113 may be composed of a plurality of materials. A surface layer 1114 of each of the pillars 1113 may include a silicon material having a first type. The surface layer 1114 of each of the pillars 1113 may include a silicon material doped with the same type impurity as that of the substrate 1111. In the description, it is exemplarily assumed that the surface layer 1114 of each of the pillars 1113 includes p-type silicon. However, the surface layer 1114 of each of pillars 1113 is not limited to being p-type silicon.

An inner layer 1115 of each of the pillars 1113 may be formed of an insulation material. For example, the inner layer 1115 of each of the pillars 1113 may be filled with an insulation material such as silicon oxide.

In a region between the first and second doping regions 1311 and 1312, an insulation layer 1116 may be provided along exposed surfaces of the insulation materials 1112, the pillars 1113, and the substrate 1111. For example, the thickness of the insulation layer 1116 may be less than half of the distance between the insulation materials 1112. That is, a region in which a material other than the insulation materials 1112 and the insulation layer 1116 is disposed may be provided between (i) the insulation layer 1116 provided over the bottom surface of a first insulation material of the insulation materials 1112 and (ii) the insulation layer 1116 provided over the top surface of a second insulation material of the insulation materials 1112. The first insulation material of the insulation materials 1112 may be disposed over the second insulation material of the insulation materials 1112.

In the region between the first and second doping regions 1311 and 1312, conductive materials 1211 to 1291 may be provided over the surface of the insulation layer 1116. For example, the conductive material 1211 extending along the first direction may be provided between the substrate 1111 and the insulation materials 1112 adjacent to the substrate 1111. More specifically, the conductive material 1211 extending along the first direction may be provided between (i) the insulation layer 1116 disposed at the bottom surface of the insulation materials 1112 adjacent to the substrate 1111 and (ii) the insulation layer 1116 disposed over the substrate 1111.

A conductive material extending along the first direction may be provided between (I) the insulation layer 1116 disposed at the top surface of a first specific insulation material among the insulation materials 1112 and (ii) the insulation layer 1116 disposed at the bottom surface of a second specific insulation material among the insulation materials 1112, which is disposed over the first specific insulation material 1112. For example, a plurality of conductive materials 1221 to 1281 extending along the first direction may be provided between the insulation materials 1112. Also, a conductive material 1291 extending along the first direction may be provided over the uppermost insulation materials 1112. For example, the conductive materials 1211 to 1291 extending along the first direction may be a metallic material. In another example, the conductive materials 1211 to 1291 extending along the first direction may be a conductive material such as polysilicon.

The same structure as the structure disposed between the first and second doping regions 1311 and 1312 may be provided between the second and third doping regions 1312 and 1313. For example, the plurality of insulation materials 1112 extending along the first direction, the plurality of pillars 1113 which are sequentially arranged in the first direction and penetrate the plurality of insulation materials 1112 along the second direction, the insulation layer 1116 provided over the surfaces of the plurality of insulation materials 1112 and the pillars 1113, and the conductive materials 1212 to 1292 extending along the first direction may be provided between the second and third doping regions 1312 and 1313.

The same structure as disposed between the first and second doping regions 1311 and 1312 may be provided between the third and fourth doping regions 1313 and 1314. For example, the plurality of insulation materials 1112 extending along the first direction, the plurality of pillars 1113 which are sequentially arranged in the first direction and penetrate the plurality of insulation materials 1112 along the second direction, the insulation layer 1116 provided over the surfaces of the plurality of insulation materials 1112 and the plurality of pillars 1113, and the plurality of conductive materials 1213 to 1293 extending along the first direction may be provided between the third and fourth doping regions 1313 and 1314.

Drains 1320 may be provided over the plurality of pillars 1113, respectively. For example, the drains 1320 may be a silicon material doped with a second type material. For example, the drains 1320 may be a silicon material doped with an n-type material. In the description, it is exemplarily assumed that the drains 320 are a silicon material doped with an n-type material. However, the drains 320 are not limited to being n-type silicon materials. For example, the width of the drains 1320 may be wider than that of a corresponding one of the pillars 1113. For example, the drains 1320 may be provided over a top surface of the corresponding one of the pillars 1113, in a pad shape.

Conductive materials 1331 to 1333 extending in the third direction may be provided over the drains 1320. The conductive materials 1331 to 1333 may be sequentially disposed along the first direction. The conductive materials 1331 to 1333 may be respectively coupled to the drains 1320 in the corresponding region. For example, the drains 1320 and the conductive material 1333 extending along the third direction may be coupled through contact plugs, respectively. For example, the conductive materials 1331 to 1333 extending along the third direction may be a metallic material. In another example, the conductive materials 1331 to 1333 may be a conductive material such as polysilicon.

Referring to FIGS. 10 and 11, each of the pillars 1113 may be coupled to the insulation layer 1116 and the plurality of conductive materials 1211 to 1291, 1212 to 1292, and 1213 to 1293 extending along the first direction, to form a string. For example, each of the pillars 1113 may form a NAND string NS together with the insulation layer 1116 and the conductive materials 1211 to 1291, 1212 to 1292, and 1213 to 1293 extending along the first direction. The NAND string NS may include a plurality of transistor structures TS.

Figure 12:
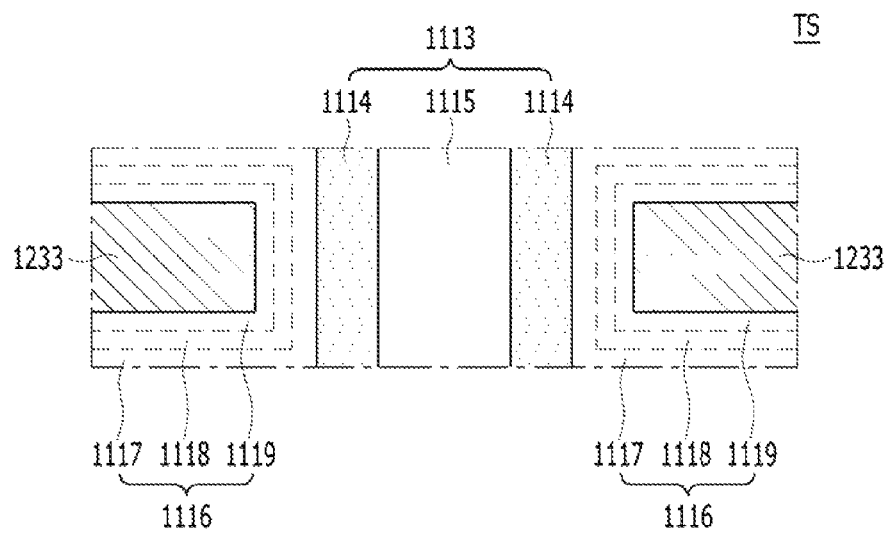

FIG. 12 is a cross-sectional view of the transistor structure TS shown in FIG. 11.

Referring to FIGS. 10 to 12, the insulation layer 1116 may include first to third sub insulation layers 1117, 1118 and 1119.

The surface layer 1114 of P-type silicon in each of the pillars 1113 may serve as a body. The first sub insulation layer 1117, adjacent to each of the pillars 1113, may serve as a tunneling insulation layer. For example, the first sub insulation layer 1117, adjacent to the each of the pillars 1113, may include a thermal oxide layer.

The second sub insulation layer 1118 may serve as a charge storage layer. For example, the second sub insulation layer 1118 may serve as a charge trap layer. The second sub insulation layer 1118 may include a nitride layer or a metal oxide layer, e.g., aluminium oxide layer, hafnium oxide layer, etc.

The third sub insulation layer 1119, adjacent to a conductive material 1233, may serve as a blocking insulation layer. For example, the third sub insulation layer 1119, adjacent to the conductive material 1233 extending along the first direction, may have a mono-layered or multi-layered structure. The third sub insulation layer 1119 may be a high dielectric layer, e.g., aluminium oxide layer, hafnium oxide layer, etc., having a dielectric constant greater than the first and second sub insulation layers 1117 and 1118.

The conductive material 1233 may serve as a gate or control gate. That is, the gate or control gate 1233, the blocking insulation layer 1119, the charge trap layer 1118, the tunneling insulation layer 1117, and the body 1114 may form a transistor or memory cell transistor structure. For example, the first to third sub insulation layers 1117 to 1119 may form an oxide-nitride-oxide (ONO) structure. In the description, the surface layer 1114 of p-type silicon in each of the pillars 1113 may be a body extending in the second direction.

The memory block BLKi may include the plurality of pillars 1113. That is, the memory block BLKi may include the plurality of NAND strings NS. More specifically, the memory block BLKi may include the plurality of NAND strings NS extending along the second direction or a direction perpendicular to the substrate 1111.

Each of the NAND strings NS may include the plurality of transistor structures TS, which are stacked in the second direction. One or more of the plurality of transistor structures TS of each NAND string NS may serve as a string select transistor SST. One or more of the plurality of transistor structures TS of each NAND string may serve as a ground select transistor GST.

The gates or control gates may correspond to the conductive materials 1211 to 1291, 1212 to 1292, and 1213 to 1293 extending along the first direction. That is, the gates or control gates may extend along the first direction to form word lines WL and two or more select lines, e.g., one or more string select line SSL and one or more ground select line GSL.

The conductive materials 1331 to 1333 extending along the third direction may be coupled to one end of the NAND strings NS. For example, the conductive materials 1331 to 1333 extending along the third direction may serve as bit lines BL. That is, in one memory block BLKi, a single bit line BL may be coupled to the plurality of NAND strings.

The second type doping regions 1311 to 1314 extending along the first direction may be coupled to the other end of the NAND strings NS. The second type doping regions 1311 to 1314 extending along the first direction may serve as common source lines CSL.

In summary, the memory block BLKi may include the plurality of NAND strings NS extending along a direction, e.g., a second direction, perpendicular to the substrate 1111, and may operate as a NAND flash memory block, for example, a charge trap type memory, in which the plurality of NAND strings NS is coupled to a single bit line BL.

With reference to FIGS. 10 to 12, it is described that the conductive materials 1211 to 1291, 1212 to 1292, and 1213 to 1293 extending along the first direction are provided on 9 layers. However, the first conductive materials 1211 to 1291, 1212 to 1292, and 1213 to 1293 extending along the first direction are not limited to having 9 layers. For example, the conductive materials extending along the first direction may be provided upon 8, 16, or more layers. That is, a NAND string may include 8, 16, or more transistors.

With reference to FIGS. 10 to 12, it is described that 3 NAND strings NS are coupled to a single bit line BL. However, the embodiment is not limited to 3 NAND strings NS coupled to a single bit line BL. In another embodiment, in the memory block BLKi, m NAND strings NS may be coupled to a single bit line BL, m being an integer. Here, the number of the conductive materials 1211 to 1291, 1212 to 1292, and 1213 to 1293 extending along the first direction and the number of common source lines 1311 to 1314 may also be adjusted to correspond to the number of NAND strings NS coupled to a single bit line BL.

With reference to FIGS. 10 to 12, it is described that 3 NAND strings NS are coupled to a single conductive material extending along the first direction. However, the embodiment is not limited to being 3 NAND strings NS coupled to a single conductive material. In another embodiment, n NAND strings NS may be coupled to a single conductive material, n being an integer. Here, the number of the conductive materials 1331 to 1333 extending along the third direction may also be adjusted to correspond to the number of NAND strings NS coupled to a single conductive material.

Figure 13:
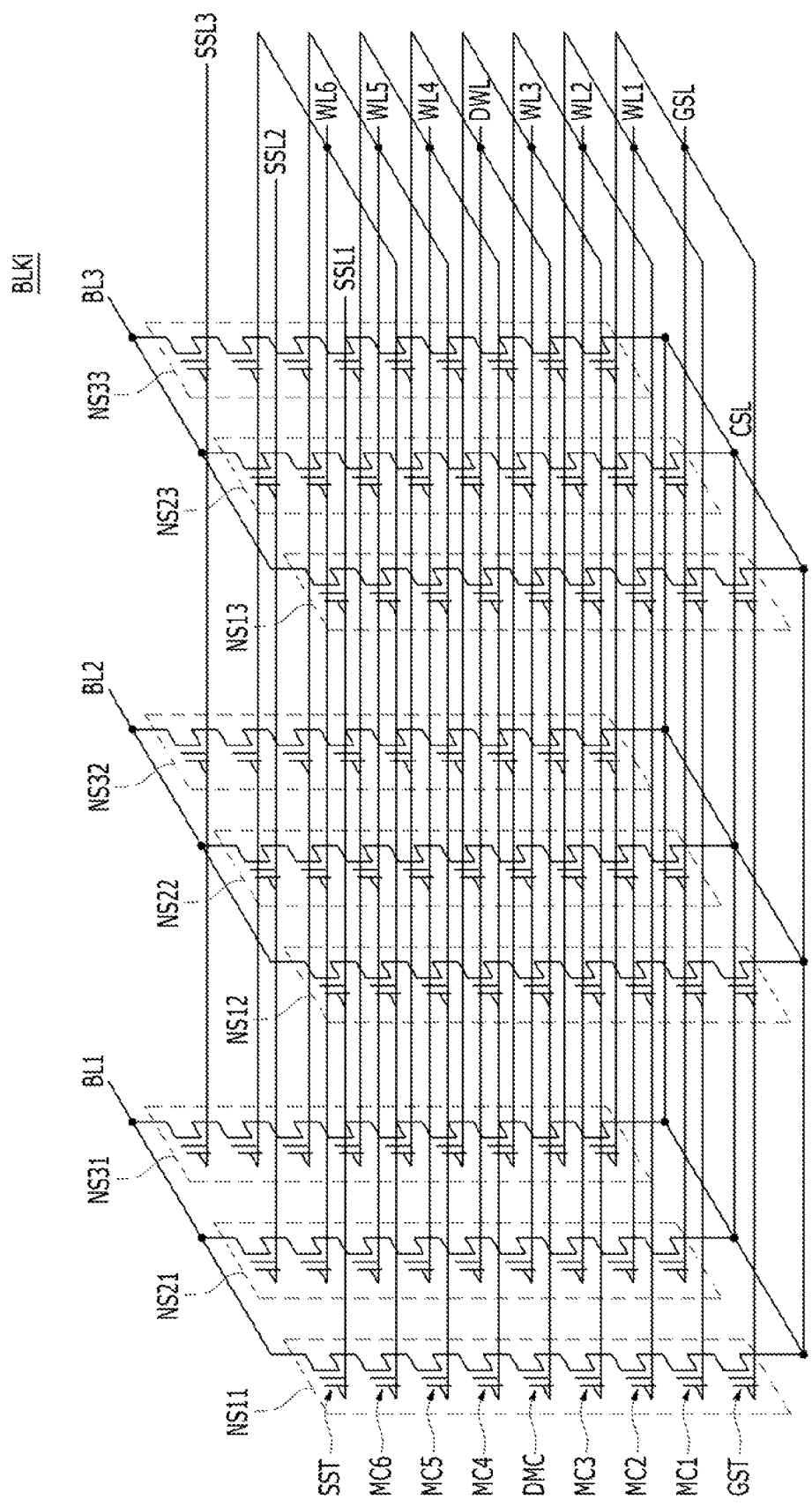

FIG. 13 is an equivalent circuit diagram illustrating the memory block BLKi described with reference to FIGS. 10 to 12.

Referring to FIGS. 10 to 13, NAND strings NS11 to NS31 may be provided between a first bit line BL1 and a common source line CSL. The first bit line BL1 may correspond to the conductive material 1331 extending along the third direction. NAND strings NS12 to NS32 may be provided between a second bit line BL2 and the common source line CSL. The second bit line BL2 may correspond to the conductive material 1332 extending along the third direction. NAND strings NS13 to NS33 may be provided between a third bit line BL3 and the common source line CSL. The third bit line BL3 may correspond to the conductive material 1333 extending along the third direction.

A string select transistor SST of each NAND string NS may be coupled to a corresponding bit line BL. A ground select transistor GST of each NAND string NS may be coupled to the common source line CSL. Memory cells MC may be provided between the string select transistor SST and the ground select transistor GST of each NAND string NS.

The NAND strings NS may be defined in units of rows and columns. The NAND strings NS commonly coupled to a single bit line may form a single column. For example, the NAND strings NS11 to NS31 coupled to the first bit line BL1 may correspond to a first column. The NAND strings NS12 to NS32 coupled to the second bit line BL2 may correspond to a second column. The NAND strings NS13 to NS33 coupled to the third bit line BL3 may correspond to a third column.

The NAND strings NS coupled to a single string select line SSL may form a single row. For example, the NAND strings NS11 to NS13 coupled to a first string select line SSL1 may form a first row. The NAND strings NS21 to NS23 coupled to a second string select line SSL2 may form a second row. The NAND strings NS31 to NS33 coupled to a third string select line SSL3 may form a third row.

A height may be defined for each NAND string NS. For example, the height of the ground select transistor GST may be defined as a value '1' in each NAND string NS. In each NAND string NS, the closer to the string selection transistor SST, the higher the height of the memory cell with reference to the substrate 1111, when measured from the substrate 1111. In each NAND string NS, the height of the memory cell MC6 adjacent to the string select transistor SST may be defined as a value '8', which is 8 times greater than the ground select transistor GST.

The string select transistors SST of the NAND strings NS of the same row may share the same string select line SSL. The string select transistors SST of the NAND strings NS in different rows may be coupled with different string select lines SSL1, SSL2, and SSL3, respectively.

The memory cells MC having the same height in the NAND strings NS of the same row may share a word line WL. At a predetermined height, the word line WL may be shared by the memory cells MC of the NAND strings NS in different rows but in the same level or at the same height. At a predetermined height or at the same level, dummy memory cells DMC of the NAND strings NS of the same row may share a dummy word line DWL. At a predetermined height or level, the dummy memory cells DMC of the NAND strings NS in different rows may share the dummy word lines DWL.

For example, the word lines WL or the dummy word lines DWL located at the same level or height or layer may be commonly coupled on layers where the conductive materials 1211 to 1291, 1212 to 1292, and 1213 to 1293 extending in the first direction are provided. For example, the conductive materials 1211 to 1291, 1212 to 1292, and 1213 to 1293 provided at a given level or height or layer may be coupled to an upper layer via a contact. The conductive materials 1211 to 1291, 1212 to 1292, and 1213 to 1293 extending in the first direction may be coupled in common at the upper layer. The ground select transistors GST of the NAND strings NS of the same row may share the ground select line GSL. The ground select transistors GST of the NAND strings NS in different rows may share the ground select line GSL. That is, the NAND strings NS11 to NS13, NS21 to NS23, and NS31 to NS33 may be coupled in common to the ground select line GSL.

The common source line CSL may be commonly coupled to the NAND strings NS. For example, the first to fourth doping regions 1311 to 1314 may be coupled at an active region of the substrate 1111. For example, the first to fourth doping regions 1311 to 1314 may be coupled to an upper layer via a contact. The first to fourth doping regions 1311 to 1314 may be coupled in common at the upper layer.

As illustrated in FIG. 13, the word lines WL at the same height or level may be commonly coupled. Therefore, when a word line WL at a specific height is selected, all of the NAND strings NS coupled to the selected word line WL may be selected. The NAND strings NS in different rows may be coupled to different string select lines SSL. Accordingly, among the NAND strings NS coupled to the same word line WL, the NAND strings NS of the unselected row may be electrically isolated from the bit lines BL1 to BL3 according to selection of the string selection lines SSL1 to SSL3. That is, a row of the NAND strings NS may be selected by selecting one of the string select lines SSL1 to SSL3. The NAND strings NS of the selected row may be selected in units of columns according to selection of the bit lines BL1 to BL3.

In each NAND string NS, a dummy memory cell DMC may be provided. FIG. 13 shows the dummy memory cell DMC provided between the third memory cell MC3 and the fourth memory cell MC4 in each NAND string NS. That is, the first to third memory cells MC1 to MC3 may be provided between the dummy memory cell DMC and the ground select transistor GST. The fourth to sixth memory cells MC4 to MC6 may be provided between the dummy memory cell DMC and the string select transistor SST. In the embodiment, it is exemplarily assumed that the memory cells MC in each NAND string NS are divided into memory cell groups by the dummy memory cell DMC. A memory cell group, e.g., MC1 to MC3, that is adjacent to the ground select transistor GST among the memory cell groups may be referred to as a lower memory cell group. A memory cell group, e.g., MC4 to MC6, adjacent to the string select transistor SST among the memory cell groups may be referred to as an upper memory cell group.

An operating method of a non-volatile memory device which includes one or more cell strings each arranged in a direction perpendicular to a substrate coupled with a memory controller and including memory cells, a string select transistor, and a ground select transistor will be described with reference to FIGS. 9 to 13. With the operating method, the non-volatile memory device: may be provided with a first read command to perform first and second hard decision read operations according to a first hard decision read voltage and a second hard decision read voltage, which is different from the first hard decision read voltage; may acquire hard decision read data; may select one of the first and second hard decision voltages based on an error bit state of the hard decision read data; may acquire soft decision read data according to a soft decision read voltage, which is different from the first and second hard decision read voltages; and may provide the soft decision read data to a memory controller.

Figure 14:
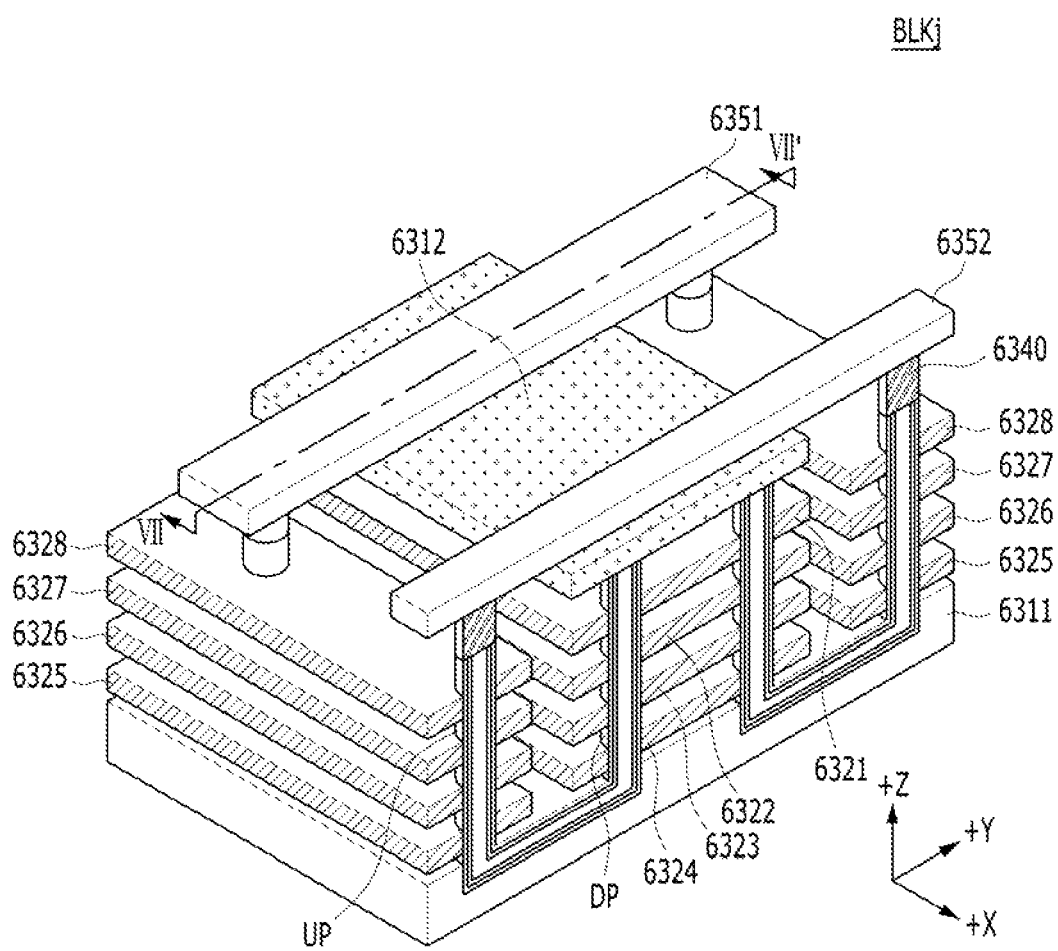
FIGS. 14 to 16 are diagrams schematically illustrating a 3D non-volatile memory device in accordance with an embodiment of the present invention.
Figure 15:
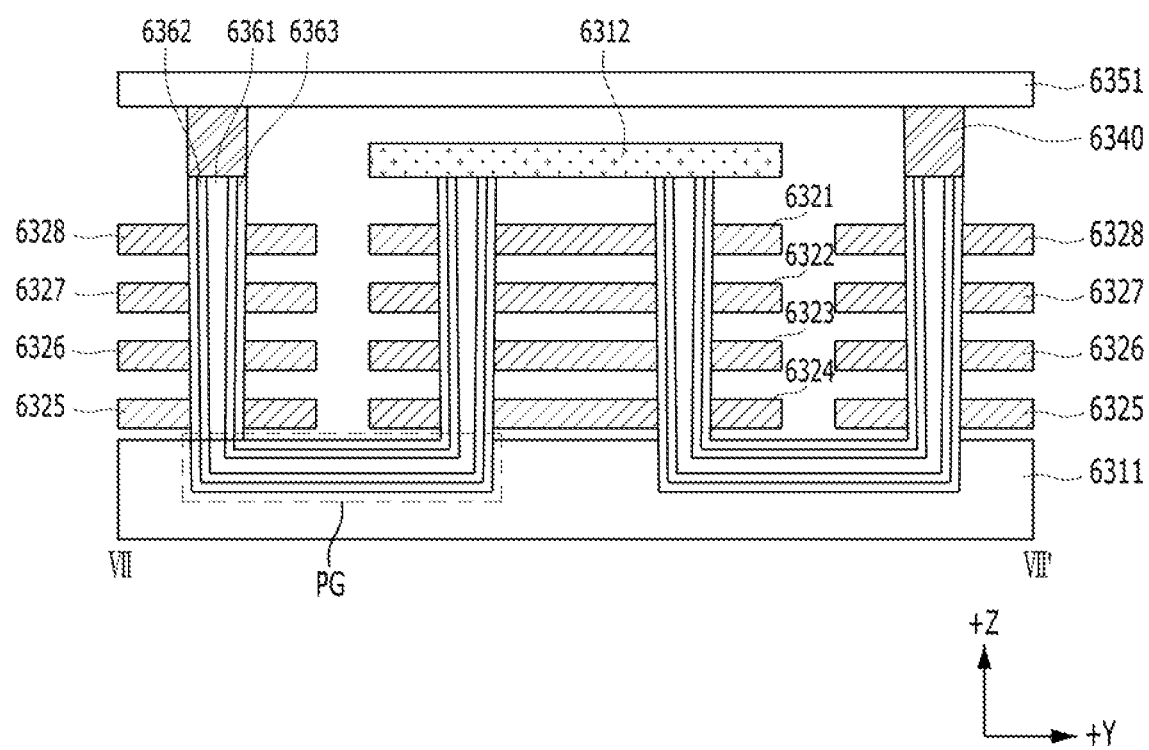
Figure 16:
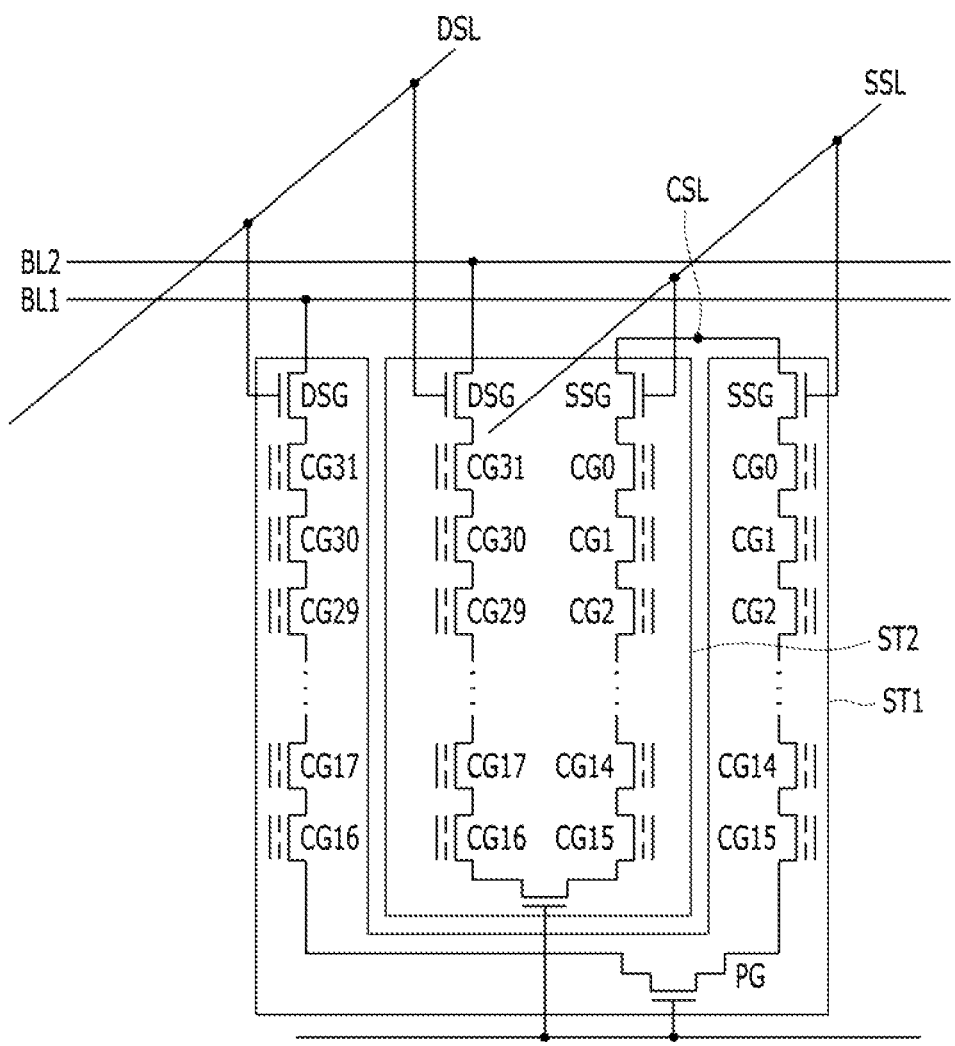

FIGS. 14 to 16 are diagrams schematically illustrating a 3D non-volatile memory device in accordance with an embodiment of the present invention. FIGS. 14 to 16 illustrate the semiconductor memory device, for example a flash memory device implemented in 3D in accordance with an embodiment of the present invention.

FIG. 14 is a perspective view illustrating one memory block BLKj of the memory blocks 211 shown in FIG. 4A. FIG. 15 is a sectional view Illustrating the memory block BLKj taken along the line VII-VII' shown in FIG. 14.

Referring to FIGS. 14 and 15, the memory block BLKj may include a structure extending along first to third directions.

A substrate 6311 may be provided. For example, the substrate 6311 may include a silicon material doped by a first type impurity. For example, the substrate 6311 may include a silicon material doped by a p-type impurity or a p-type well, e.g., a pocket p-well. The substrate 6311 may further include an n-type well surrounding the p-type well. In the embodiment, it is exemplarily assumed that the substrate 6311 is p-type silicon. However, the substrate 6311 is not limited to being p-type silicon.

First to a fourth conductive material layers 6321 to 6324 extending along the X-direction and the Y-direction may be disposed over the substrate 6311. The first to fourth conductive material layers 6321 to 6324 may be spaced from one another in the Z-direction.

Fifth to eighth conductive material layers 6325 to 6328 extending along the X-direction and the Y-direction may be disposed over the substrate 6311. The fifth to eighth conductive material layers 6325 to 6328 may be spaced from one another in the Z-direction. The fifth to eighth conductive material layers 6325 to 6328 may be spaced from the first to fourth conductive material layers 6321 to 6324 in the Y-direction.

A plurality of lower pillars DP may be formed to penetrate the first to fourth conductive material layers 6321 to 6324. Each of the lower pillars DP may be extended in the Z-direction. A plurality of upper pillars UP may be formed to penetrate the fifth to eighth conductive material layers 6325 to 6328. Each of the upper pillars UP may be extended in the Z-direction.

Each of the lower pillars DP and the upper pillars UP may include an internal material layer 6361, a middle layer 6362 and a surface layer 6363. The middle layer 6362 may serve as a channel of the cell transistor. The surface layer 6363 may include a blocking insulating layer, an electric charge storage layer, and a tunnel insulating layer.

The lower pillars DP and the upper pillars UP may be coupled through a pipe gate PG. The pipe gate PG may be formed in the substrate 6311. For example, the pipe gate PG may include substantially the same material as the lower pillars DP and the upper pillars UP.

A doping material layer 6312 doped with a second type impurity may be disposed over the lower pillars DP. The doping material layer 6312 may extend in the X direction and the Y direction. For example, the doping material layer 6312 doped with the second type impurity may include an n-type silicon material. The doping material layer 6312 doped with the second type impurity may serve as the common source line CSL.

Drains 6340 may be formed over each of the upper pillars UP. For example, the drain 6340 may include an n-type silicon material. First and second upper conductive material layers 6351 and 6352 may be formed over the drains 6340. The first and second upper conductive material layers 6351 and 6352 may be extended in the Y-direction.

The first and second upper conductive material layers 6351 and 6352 may be spaced apart from each other in the X-direction. For example, the first and second upper conductive material layers 6351 and 6352 may be made of metal. For example, the first and second upper conductive material layers 6351 and 6352 may be coupled to the drains 6340 through contact plugs. The first and second upper conductive material layers 6351 and 6352 may serve as first and second bit lines BL1 and BL2, respectively.

The first conductive material layer 6321 may serve as the source select line SSL, and the second conductive material layer 6322 may serve as the first dummy word line DWL1, and the third and fourth conductive material layers 6323 and 6324 may serve as the first and second main word lines MWL1 and MWL2, respectively. The fifth and sixth conductive material layers 6325 and 6326 may serve respectively as the third and fourth main word lines MWL3 and MWL4, the seventh conductive material layer 6327 may serve as the second dummy word line DWL2, and the eighth conductive material layer 6328 may serve as the drain select line DSL.

Each of the lower pillars DP and the first to fourth conductive material layers 6321 to 6324 adjacent to the lower pillar DP may form a lower string. Each of the upper pillars UP and the fifth to eighth conductive material layers 6325 to 6328 adjacent to the upper pillar UP may form an upper string. The lower string and the upper string may be coupled through the pipe gate PG. One end of the lower string may be coupled to the second-type doping material layer 6312 serving as the common source line CSL. One end of the upper string may be coupled to a corresponding bit line through the drain 6340. The lower string and the upper string are coupled through the pipe gate PG. A single lower string and a single upper string may form a single cell string coupled between the second-type doping material layer 6312 serving as the common source line CSL and a corresponding one of the upper conductive material layers 6351 and 6352 serving as the bit line BL.

That is, the lower string may include the source select transistor SST, the first dummy memory cell DMC1, and the first and second main memory cells MMC1 and MMC2. The upper string may include the third and fourth main memory cells MMC3 and MMC4, the second dummy memory cell DMC2 and the drain select transistor DST.

Referring to FIGS. 14 and 15, the upper string and the lower string may form the NAND string NS having a plurality of transistor structures TS. The transistor structure TS may be substantially the same as the transistors described with reference to FIG. 12.

FIG. 16 is an equivalent circuit diagram Illustrating the memory block BLKj described with reference to FIGS. 14 and 15. FIG. 16 exemplarily shows first and second strings among the strings included in the memory block BLKj.

Referring to FIG. 16, the memory block BLKj may include a plurality of cell strings, each of which comprises a single upper string and a single lower string coupled to each other through the pipe gate PG, as described with reference to FIGS. 14 and 15.

In the memory block BLKj, memory cells CG0 to CG31 stacked along a first channel layer CH1 (not shown), one or more source selection gates SSG, and one or more drain selection gates DSG may form a first string ST1. Memory cells CG0 to CG31 stacked along a second channel layer CH2 (not shown), one or more source selection gates SSG, and one or more drain selection gates DSG may form a second string ST2.

The first and second strings ST1 and ST2 may be coupled to a single drain selection line DSL and a single source selection line SSL. The first string ST1 may be coupled to a first bit line BL1, and the second string ST2 may be coupled to a second bit line BL2.

FIG. 16 shows the first and second strings ST1 and ST2 coupled to a single drain selection line DSL and a single source selection line SSL. In another embodiment, the first and second strings ST1 and ST2 may be coupled to a single source selection line SSL and a single bit line BL. In such case, the first string ST1 may be coupled to the first drain selection line DSL1, and the second string ST2 may be coupled to the second drain selection line DSL2. In another embodiment, the first and second strings ST1 and ST2 may be coupled to a single drain selection line DSL and a single bit line BL.

In such case, the first string ST1 may be coupled to the first source selection line SSL1, and the second string ST2 may be coupled to the second source selection line SSL2.

Figure 17:
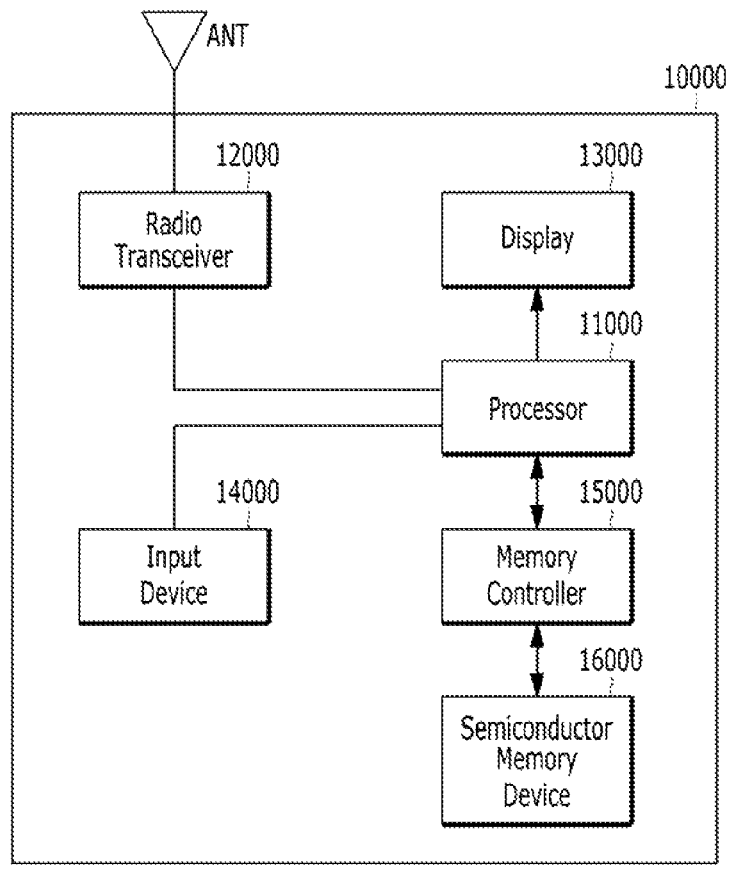
FIG. 17 is a block diagram schematically illustrating an electronic device including a semiconductor memory system in accordance with an embodiment of the present invention.

FIG. 17 is a block diagram schematically illustrating an electronic device 10000 including a memory controller 15000 and a semiconductor memory device 16000 in accordance with an embodiment of the present invention.

Referring to FIG. 17, the electronic device 10000 such as a cellular phone, a smart phone, or a tablet PC may include the semiconductor memory device 16000 implemented by a flash memory device and the memory controller 15000 to control the semiconductor memory device 16000.

The semiconductor memory device 16000 may correspond to the semiconductor memory device 200 described above with reference to FIGS. 3 to 13. The semiconductor memory device 16000 may store random data.

The memory controller 15000 may correspond to the memory controller described with reference to FIGS. 3 to 13. The memory controller 15000 may be controlled by a processor 11000 which controls overall operations of the electronic device 10000.

Data stored in the semiconductor memory device 16000 may be displayed through a display 13000 under the control of the memory controller 15000. The memory controller 15000 operates under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000, and may be implemented by a pointing device such as a touch pad or a computer mouse, a key pad, or a keyboard.

The processor 11000 may control the display 13000 such that the data from the semiconductor memory device 16000, the radio signal from the radio transceiver 12000 or the data from the input device 14000 is displayed through the display 13000.

Figure 18:
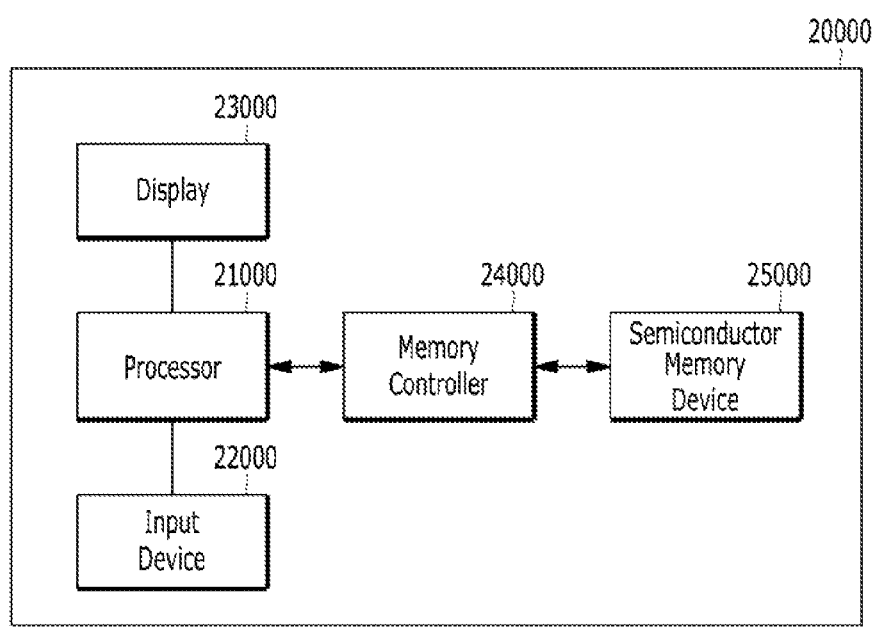
FIG. 18 is a block diagram schematically illustrating an electronic device including a semiconductor memory system in accordance with an embodiment of the present invention.

FIG. 18 is a block diagram schematically illustrating an electronic device 20000 including a memory controller 24000 and a semiconductor memory device 25000 in accordance with an embodiment of the present invention.

The memory controller 24000 and the semiconductor memory device 25000 may correspond to the memory controller 100 and the semiconductor memory device 200 described with reference to FIGS. 3 to 13, respectively.

Referring to FIG. 18, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player, and may include the semiconductor memory device 25000, e.g., the flash memory device, and the memory controller 24000 to control operations of the semiconductor memory device 25000.

The electronic device 20000 may include a processor 21000 to control overall operations of the electronic device 20000. The memory controller 24000 may be controlled by the processor 21000.

The processor 21000 may display data stored in the semiconductor memory device 25000 through a display 23000 according to an input signal from an input device 22000. For example, the input device 22000 may be implemented by a pointing device such as a touch pad or a computer mouse, a key pad, or a keyboard.

Figure 19:
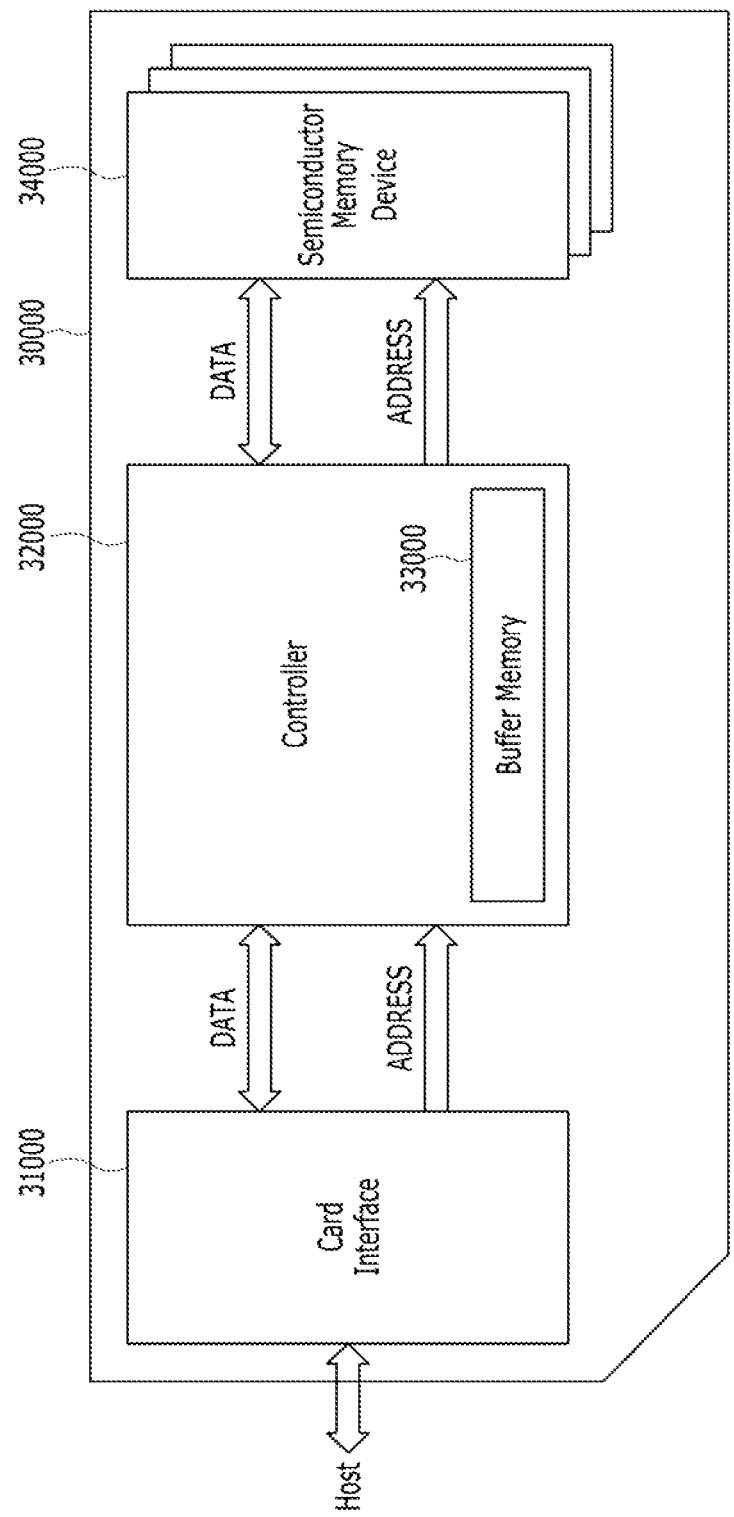
FIG. 19 is a block diagram schematically illustrating an electronic device including a semiconductor memory system in accordance with an embodiment of the present invention.

FIG. 19 is a block diagram schematically illustrating an electronic device 30000 including a controller 32000 and a semiconductor memory device 34000 in accordance with an embodiment of the present invention.

The controller 32000 and the semiconductor memory device 34000 may correspond to the memory controller 100 and the semiconductor memory device 200 described with reference to FIGS. 3 to 13, respectively.

Referring to FIG. 19, the electronic device 30000 may include a card interface 31000, the controller 32000, and the semiconductor memory device 34000, for example, a flash memory device.

The electronic device 30000 may exchange data with a host through the card interface 31000. The card interface 31000 may be a secure digital (SD) card interface or a multi-media card (MMC) interface, which will not limit the scope of the present invention. The card interface 31000 may interface the host and the controller 32000 according to a communication protocol of the host capable of communicating with the electronic device 30000.

The controller 32000 may control an overall operation of the electronic device 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic device 30000 is connected with the host such as a PC, a tablet PC, a digital camera, a digital audio player, a mobile phone, console video game hardware or a digital set-top box, the host may exchange data with the semiconductor memory device 34000 through the card interface 31000 and the controller 32000.

Figure 20:
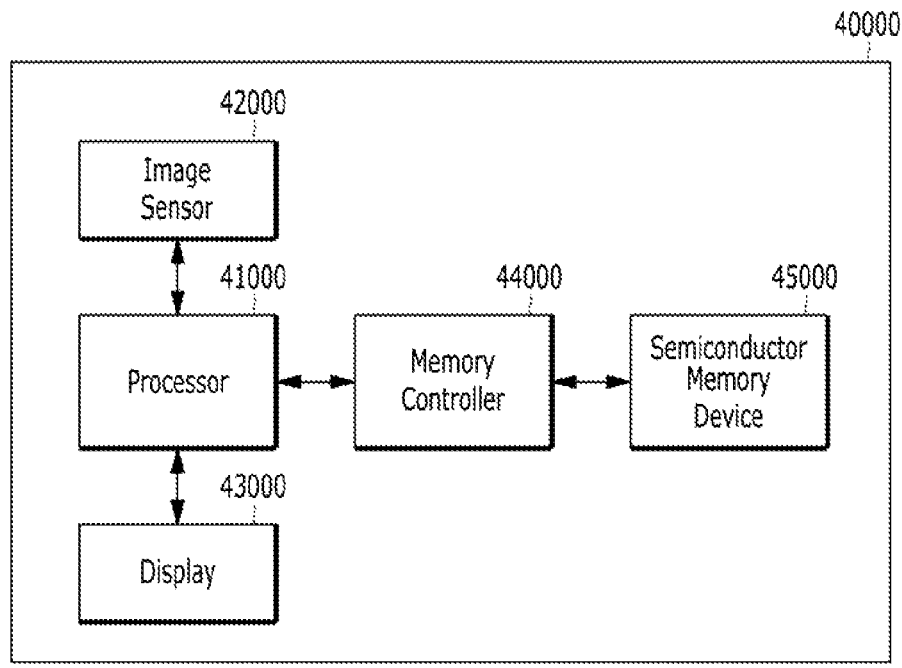
FIG. 20 is a block diagram schematically illustrating an electronic device including a semiconductor memory system in accordance with an embodiment of the present invention.

FIG. 20 is a block diagram schematically illustrating an electronic device 40000 including a memory controller 44000 and a semiconductor memory device 45000 in accordance with an embodiment of the present invention.

The memory controller 44000 and the semiconductor memory device 45000 may correspond to the memory controller 100 and the semiconductor memory device 200 described with reference to FIGS. 3 to 13, respectively.

Referring to FIG. 20, the electronic device 40000 may include the semiconductor memory device 45000, e.g., the flash memory device, the memory controller 44000 to control a data processing operation of the semiconductor memory device 45000, and a processor 41000 to control overall operations of the electronic device 40000.

Further, an image sensor 42000 of the electronic device 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

Figure 21:
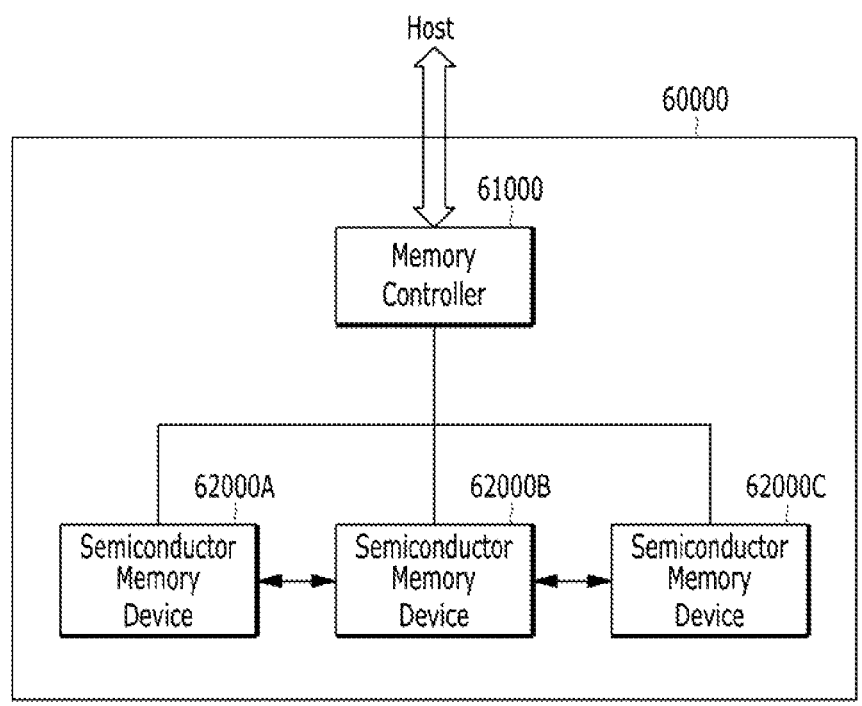
FIG. 21 is a block diagram schematically illustrating an electronic device including a semiconductor memory system in accordance with an embodiment of the present invention.

FIG. 21 is a block diagram schematically illustrating an electronic device 60000 including a memory controller 61000 and semiconductor memory devices 62000A, 62000B, and 62000C in accordance with an embodiment of the present invention.

The memory controller 61000 and each of the semiconductor memory devices 62000A, 62000B, and 62000C may correspond to the memory controller 100 and the semiconductor memory device 200 described with reference to FIGS. 3 to 13, respectively.

Referring to FIG. 21, the electronic device 60000 may be implemented by a data storage device such as a solid state drive (SSD).

The electronic device 60000 may include the plurality of semiconductor memory devices 62000A, 62000B, and 62000C and the memory controller 61000 to control a data processing operation of each of the semiconductor memory devices 62000A, 62000B, and 62000C.

The electronic device 60000 may be implemented by a memory system or a memory module.

For example, the memory controller 61000 may be implemented outside or inside the electronic device 60000.

Figure 22:
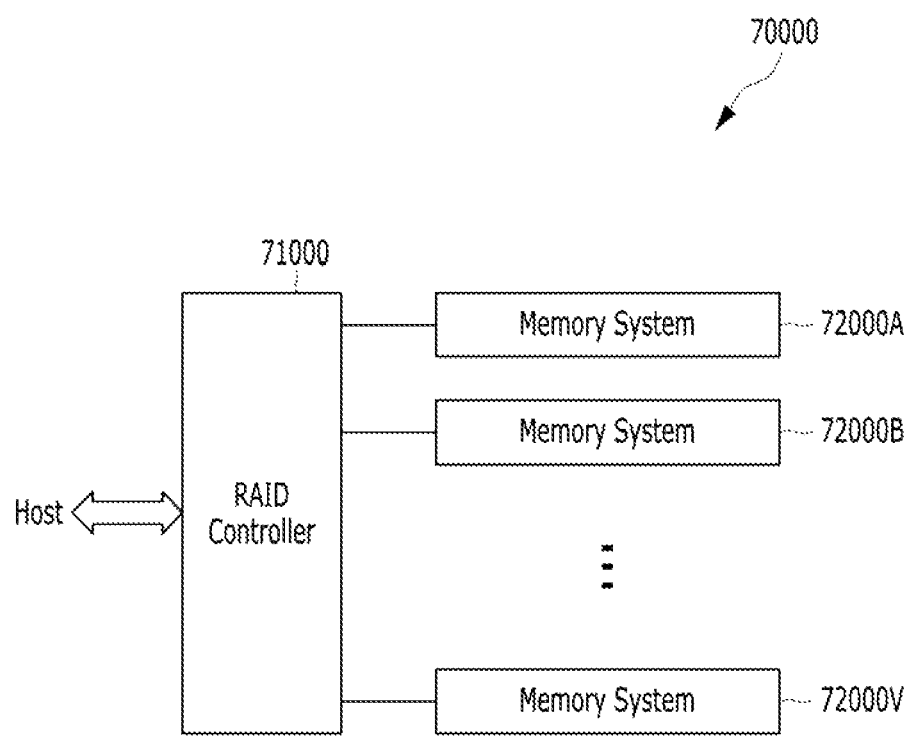
FIG. 22 is a block diagram of a data processing system including an electronic device shown in FIG. 21.

FIG. 22 is a block diagram of a data processing system including the electronic device 6000 described with reference to FIG. 21.

Referring to FIGS. 21 and 22, a data storage device 70000 may be implemented by a redundant array of independent disks (RAID) system. The data storage device 70000 may include a RAID controller 71000 and a plurality of memory systems 72000A to 72000N, where N is a natural number.

Each of the memory systems 72000A to 72000N may correspond to the electronic device 60000 described with reference to FIG. 21. The memory systems 72000A to 72000N may form a RAID array. The data storage device 70000 may be implemented by an SSD.

During a program operation, the RAID controller 71000 may output program data, which is output from a host, to one of the memory systems 72000A to 72000N according to one selected from a plurality of RAID levels based on RAID level information output from the host.

During a read operation, the RAID controller 71000 may transfer data, which is read from one of the memory systems 72000A to 72000N, to the host according to one of the RAID levels based on the RAID level information output from the host.

While the present invention has been described with respect to specific embodiments, it will be apparent to those skilled in the art that various changes and modifications may be made without departing from the spirit and scope of the invention as defined in the following claims.

What is claimed is:

1. An operating method of a memory controller, comprising:
   generating soft decision read data for stored data read from a semiconductor memory device according to a soft decision read voltage, wherein the stored data is stored in the semiconductor memory device through sequential operations of ECC encoding and then scrambling;
   generating a first de-scrambled data by performing a de-scrambling operation to a sign bit of the soft decision read data; and
   performing a first ECC decoding operation to the first de-scrambled data.

2. The operating method of claim 1, wherein the first ECC decoding operation is performed according to an ECC algorithm based on a bilateral-symmetry channel.

3. The operating method of claim 2, wherein the bilateral-symmetry channel is an additive white gaussian noise (AWGN) channel.

4. The operating method of claim 2, wherein the first ECC decoding operation is a low density parity check (LDPC) decoding operation.

5. The operating method of claim 1, wherein the soft decision read data is a log likelihood ratio (LLR).

6. The operating method of claim 1, wherein, before the generating of the soft decision read data, operating method further comprises:
   generating second de-scrambled data by performing a de-scrambling operation to stored data read from the semiconductor memory device according to a hard decision read voltage, wherein the de-scrambling operation corresponds to the scrambling operation; and
   performing a second ECC decoding operation to the second de-scrambled data.

7. The operating method of claim 5, wherein the generating of the soft decision read data is performed when the second ECC decoding operation fails.

8. A memory controller, comprising:
   a soft decision read data generation unit suitable for generating soft decision read data for stored data read from a semiconductor memory device according to a soft decision read voltage, wherein the stored data is stored in the semiconductor memory device through sequential operations of ECC encoding and then scrambling;
   a de-scrambling unit suitable for generating first de-scrambled data by performing de-scrambling operation to a sign bit of the soft decision read data; and
   an ECC decoding unit suitable for performing a first ECC decoding operation to the first de-scrambled data.

9. The memory controller of claim 8, wherein the ECC decoding unit performs the first ECC decoding operation according to an ECC algorithm based on a bilateral-symmetry channel.

10. The memory controller of claim 9, wherein the bilateral-symmetry channel is an additive white gaussian noise (AWGN) channel.

11. The memory controller of claim 9, wherein the first ECC decoding operation is a low density parity check (LDPC) decoding operation.

12. The memory controller of claim 8, wherein the soft decision read data is a log likelihood ratio (LLR).

13. The memory controller of claim 8,
   wherein, before the soft decision read data generation unit generates the soft decision read data, the de-scrambling unit further generates second de-scrambled data by performing de-scrambling operation to stored data read from the semiconductor memory device according to a hard decision read voltage, wherein the de-scrambling operation corresponds to the scrambling operation, and
   further comprising an ECC decoding unit suitable for performing a second ECC decoding operation to the second de-scrambled data.

14. The operating method of claim 13, wherein the soft decision read data generation unit generates the soft decision read data when the ECC decoding unit fails the second ECC decoding operation.

15. A semiconductor memory system, comprising:
   a semiconductor memory device; and
   a controller,
   wherein the controller comprises:
   a soft decision read data generation unit suitable for generating soft decision read data for stored data read from the semiconductor memory device according to a soft decision read voltage, wherein the stored data is stored in the semiconductor memory device through sequential operations of ECC encoding and then scrambling;
   a de-scrambling unit suitable for generating first de-scrambled data by performing a de-scrambling operation to a sign bit of the soft decision read data; and
   an ECC decoding unit suitable for performing a first ECC decoding operation to the first de-scrambled data.

16. The semiconductor memory system of claim 15, wherein the ECC decoding unit performs the first ECC decoding operation according to an ECC algorithm based on a bilateral-symmetry channel.

17. The semiconductor memory system of claim 15, wherein the soft decision read data is a log likelihood ratio (LLR).

* * * * *